US011704549B2

(12) United States Patent
Van Der Made et al.

(10) Patent No.: US 11,704,549 B2
(45) Date of Patent: *Jul. 18, 2023

(54) EVENT-BASED CLASSIFICATION OF FEATURES IN A RECONFIGURABLE AND TEMPORALLY CODED CONVOLUTIONAL SPIKING NEURAL NETWORK

(71) Applicant: BrainChip, Inc., Laguna Hills, CA (US)

(72) Inventors: Peter Aj Van Der Made, Nedlands (AU); Anil S. Mankar, Laguna Hills, CA (US); Kristofor D. Carlson, Laguna Hills, CA (US); Marco Cheng, Laguna Hills, CA (US)

(73) Assignee: BrainChip, Inc., Laguna Hills, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/576,103

(22) Filed: Jan. 14, 2022

(65) Prior Publication Data
US 2022/0138543 A1 May 5, 2022

Related U.S. Application Data

(63) Continuation of application No. 16/938,254, filed on Jul. 24, 2020, now Pat. No. 11,227,210.

(Continued)

(51) Int. Cl.
*G06N 3/063* (2023.01)
*G11C 11/41* (2006.01)
(Continued)

(52) U.S. Cl.
CPC ............ *G06N 3/063* (2013.01); *G06N 3/049* (2013.01); *G06N 3/08* (2013.01); *G06T 3/4046* (2013.01); *G11C 11/41* (2013.01); *G11C 11/54* (2013.01)

(58) Field of Classification Search
CPC ... G11C 11/412; G11C 11/418; G11C 11/419; G11C 7/12; G11C 7/062; G11C 7/1006; G11C 11/413; G06N 3/08; G06N 3/063
See application file for complete search history.

(56) References Cited

U.S. PATENT DOCUMENTS

| 11,126,913 B2 | 9/2021 | Hunsberger et al. |
| 11,227,210 B2 | 1/2022 | van der made et al. |

(Continued)

OTHER PUBLICATIONS

International Search Report dated Oct. 13, 2020 for Appl. No. PCT/US2020/043456, 3 pages.
(Continued)

*Primary Examiner* — Ajay Ojha
(74) *Attorney, Agent, or Firm* — Sterne, Kessler, Goldstein & Fox P.L.L.C.

(57) ABSTRACT

Embodiments of the present invention provides a system and method of learning and classifying features to identify objects in images using a temporally coded deep spiking neural network, a classifying method by using a reconfigurable spiking neural network device or software comprising configuration logic, a plurality of reconfigurable spiking neurons and a second plurality of synapses. The spiking neural network device or software further comprises a plurality of user-selectable convolution and pooling engines. Each fully connected and convolution engine is capable of learning features, thus producing a plurality of feature map layers corresponding to a plurality of regions respectively, each of the convolution engines being used for obtaining a response of a neuron in the corresponding region. The neurons are modeled as Integrate and Fire neurons with a non-linear time constant, forming individual integrating threshold units with a spike output, eliminating the need for multiplication and addition of floating-point numbers.

27 Claims, 19 Drawing Sheets

Related U.S. Application Data

(60) Provisional application No. 62/878,426, filed on Jul. 25, 2019.

(51) Int. Cl.
  *G11C 11/54*   (2006.01)
  *G06N 3/08*    (2023.01)
  *G06N 3/049*   (2023.01)
  *G06T 3/40*    (2006.01)

(56) References Cited

U.S. PATENT DOCUMENTS

| | | |
|---|---|---|
| 2009/0287624 A1 | 11/2009 | Rouat et al. |
| 2010/0318487 A1 | 12/2010 | Marvasti |
| 2013/0151448 A1 | 6/2013 | Ponulak |
| 2013/0204814 A1 | 8/2013 | Hunzinger et al. |
| 2014/0081895 A1 | 3/2014 | Coenen et al. |
| 2016/0042271 A1 | 2/2016 | Yoon et al. |
| 2016/0086075 A1 | 3/2016 | Alvarez-Icaza Rivera et al. |
| 2017/0236051 A1 | 8/2017 | Van Der Made et al. |
| 2018/0225562 A1 | 8/2018 | van der Made |
| 2019/0156201 A1 | 5/2019 | Bichler et al. |
| 2021/0027152 A1 | 1/2021 | Van Der Made et al. |

OTHER PUBLICATIONS

Written Opinion dated Oct. 13, 2020 for Appl. No. PCT/US2020/043456, 4 pages.

Kheradpisheh, Saced Reza et al., "STDP-based spiking deep convolutional neural networks for object recognition," Neural Networks (2017). https://doi.org/10.1016/j.neunet.2017.12.005, 21 pages.

Hulata, Eyal et al., "A method for spike sorting and detection based on wavelet packets and Shannon's mutual information," Journal of Neuroscience Methods 117:1-12 (2002), 12 pages.

International Search Report and Written Opinion dated Apr. 28, 2022 for International Appl. No. PCT/US2022/014123, 13 pages.

Stromatias et al., "An Event-Driven Classifier for Spiking Neural Networks Fed with Synthetic or Dynamic Vision Sensor Data," Frontiers in Neuroscience 11 (2017): Article 350, Jun. 28, 2017; Retrieved on Mar. 26, 2022 from https://www.frontiersin.org; 17 pages.

EVENT-BASED CLASSIFICATION OF FEATURES IN A RECONFIGURABLE AND TEMPORALLY CODED CONVOLUTIONAL SPIKING NEURAL NETWORK

CROSS-REFERENCE TO RELATED APPLICATION(S)

This application is a continuation of U.S. Non-provisional patent application Ser. No. 16/938,254, titled "Event-based Classification of Features in a Reconfigurable and Temporally Coded Convolutional Spiking Neural Network," which was filed on Jul. 24, 2020 and issuing as U.S. Pat. No. 11,227,210 on Jan. 18, 2022, which claims the benefit of U.S. Provisional Application No. 62/878,426, filed on Jul. 25, 2019, titled "Event-based Classification of Features in a Reconfigurable and Temporally Coded Convolutional Spiking Neural Network," all of which are hereby incorporated by reference in their entirety for all purposes.

This application is related to U.S. patent application Ser. No. 16/670,368, filed Oct. 31, 2019, and U.S. Provisional Application No. 62/754,348, filed Nov. 1, 2018, each of which are herein incorporated by reference in their entireties.

BACKGROUND

Field

Embodiments herein relate to classification and object recognition and in particular to a classifying method by using temporal neural coding within a deep spiking neural network.

Background

A conventional deep convolutional neural network is comprised of many layers of neurons comprised of computed functions, whereby the input values and output value are floating-point numbers. The foremost use of convolutional neural networks is in object classification in digital images. The input values to the first layer of the neural network are samples of the signals for which classification is desired. Typical signals are sensory signals, such as visual signals, audio signals, and the like. Samples of visual signals include pixel values expressing color intensities in an image, while samples of audio signals include frequency component values as input values. Deep convolutional neural networks have three or more layers of neurons. Each layer receives inputs from the layer before it. Each input value is multiplied by a value that represents the weight of the connection, which are generally 32-bit integer or floating point numbers. Each neuron in the neural network can have many inputs, and the result of these multiplications is added to create a sum value. A non-linear function, such as the rectified linear function (ReLU) is applied to the sum value to produce an output value. The convolution is a function that is computationally applied to floating-point data to extract a feature from a defined area of the previous layer. Pooling layers are commonly inserted between convolutional layers to down-size the data. Pooling layers operate on a defined block of data from the previous layer and perform a max, average or mean pooling to reduce dimensionality.

Deep convolutional neural networks have been very successful in object classification tasks using image datasets. A typical deep convolutional neural network may need to perform in excess of 3 billion multiply-accumulate functions to classify a single object in an image. The processing nodes used in general-purpose computers are usually not fast enough to perform the billions of operations required for classification within a reasonable time span. Arrays of specialized multiply-accumulate devices, graphics processing units (GPU), vector processors, analog multipliers and Digital signal processors have been used to increase the throughput and reduce the latency of deep convolutional neural networks. All these devices have in common that they operate computational cores in parallel and process sequences of data rapid succession, thus being able to process large data sets in a short time. However, with great computational power comes high power consumption. A typical graphics processing unit may consume as much as 200 to 300 watts. There have been attempts to create devices that work by the same principles and consume less power, but due to their limited number of processing cores these are not capable of processing image data at the same speed. There is a need for a device that can classify objects in images at a high speed and at low power consumption.

Spiking neural networks have the advantage that the neural circuits consume power only when they are switching, this is, when they are producing a spike. In sparse networks, the number of spikes is designed to be minimal. The power consumption of such circuits is very low, typically thousands of times lower than the power consumed by a graphics processing unit used to perform a similar neural network function. However, up to now temporal spiking neural networks have not been able to meet the accuracy demands of image classification. Spiking neural networks comprise a network of threshold units, and spike inputs connected to weights that are additively integrated to create a value that is compared to one or more thresholds. No multiplication functions are used. Previous attempts to use spiking neural networks in classification tasks have failed because of erroneous assumptions and subsequent inefficient spike rate approximation of conventional convolutional neural networks and architectures. In spike rate coding methods, the values that are transmitted between neurons in a conventional convolutional neural network are instead approximated as spike trains, whereby the number of spikes represent a floating-point or integer value which means that no accuracy gains or sparsity benefits may be expected. Such rate-coded systems are also significantly slower than temporal-coded systems, since it takes time to process sufficient spikes to transmit a number in a rate-coded system. The present invention avoids those mistakes and returns excellent results on complex data sets and frame-based images.

SUMMARY OF THE INVENTION

Embodiments include a system that includes a spike converter configured to generate spikes from the digital input data; and an inbound filter configured to select relevant spikes from the generated spikes. Embodiments further include a memory configured to store kernels in inverted format, and further configured to store weights indexed by channel. The embodiments also include a packet collection module configured to collect the relevant spikes until a predetermined number of relevant spikes have been collected in a packet in memory, and to organize the collected relevant spikes by channel and spatial coordinates in the packet. Finally, the embodiments include a convolution neural processor configured to perform row-by-row strides in the memory, where the convolution neural processor uses a scratchpad memory within the memory.

Embodiments also include a method that includes receiving digital input data, and generating, by a spike converter, spikes from the digital input data. The embodiments further include selecting, by an inbound filter, relevant spikes from the generated spikes, as well as storing kernels in a memory in inverted format, where the storing further includes storing weights indexed by channel. The embodiments also include collecting the relevant spikes until a predetermined number of relevant spikes have been collected in a packet in memory, and organizing the collected relevant spikes by channel and spatial coordinates in the packet. Finally, the embodiments further include performing, using a convolution neural processor and a scratchpad memory, a convolution in hardware using row-by-row strides in the memory.

Further features and advantages, as well as the structure and operation of various embodiments, are described in detail below with reference to the accompanying drawings. It is noted that the specific embodiments described herein are not intended to be limiting. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the present invention and to enable a person skilled in the relevant art(s) to make and use the present invention.

Figure 13:
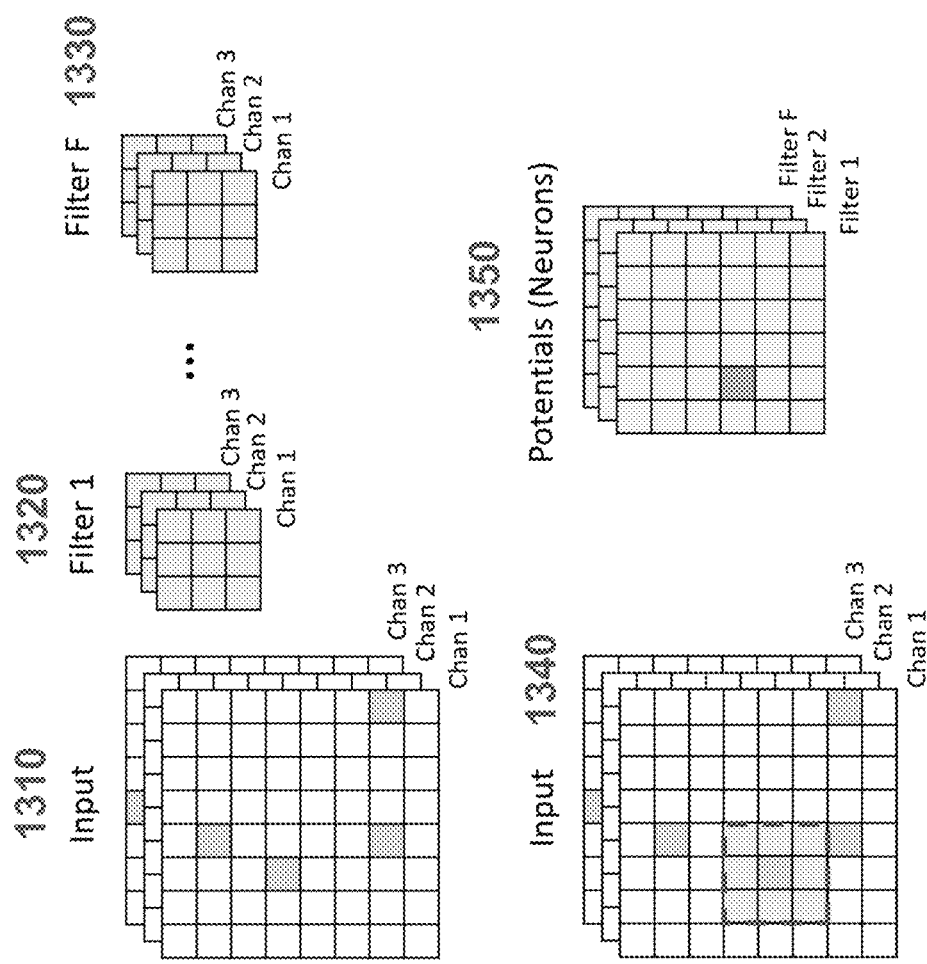

FIG. 13 describes event-based convolution using the filter and neuron terms.

Figure 14:
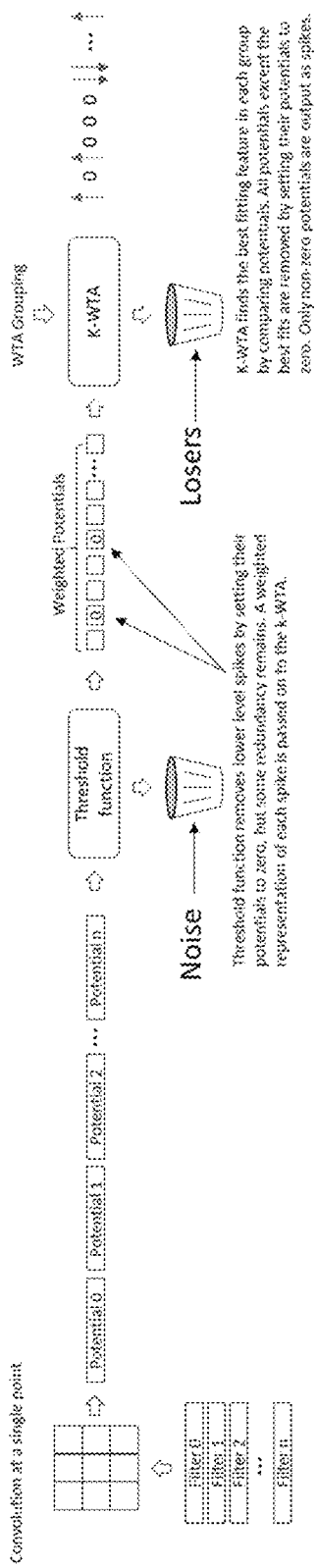

FIG. 14 illustrates the context of an exemplary K-WTA hardware implementation.

Figure 15:
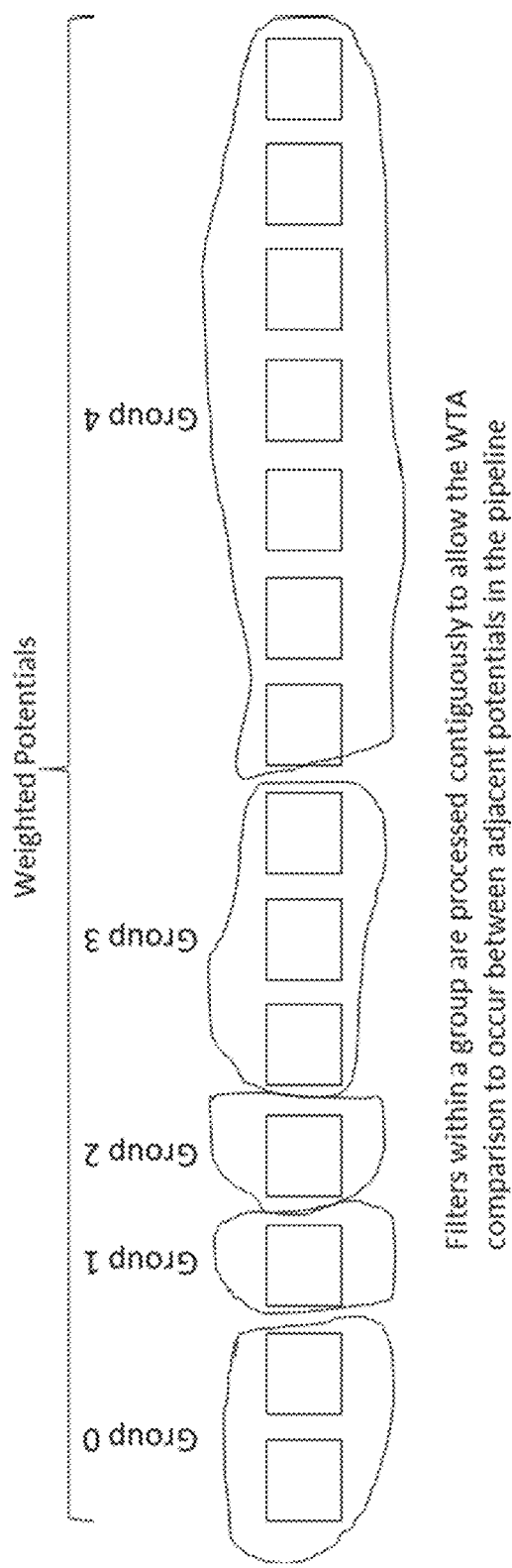

FIG. 15 illustrates the sizes of the groups can vary in size.

Figure 16:
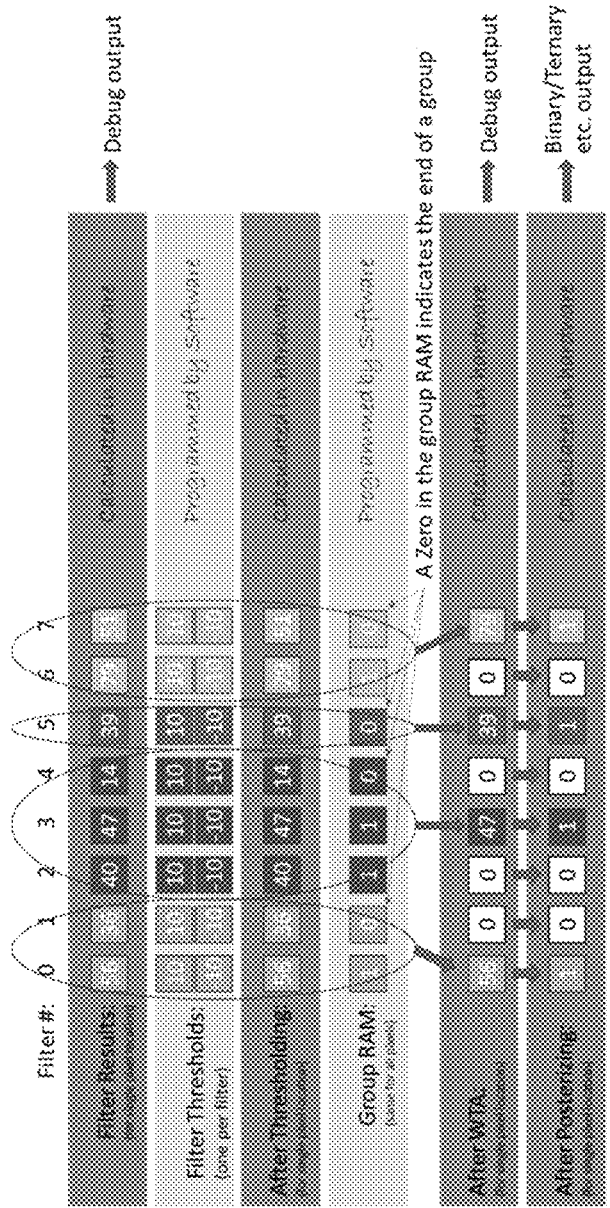

FIG. 16 illustrates how the winners are chosen in the "Best Offer" form.

Figure 17:
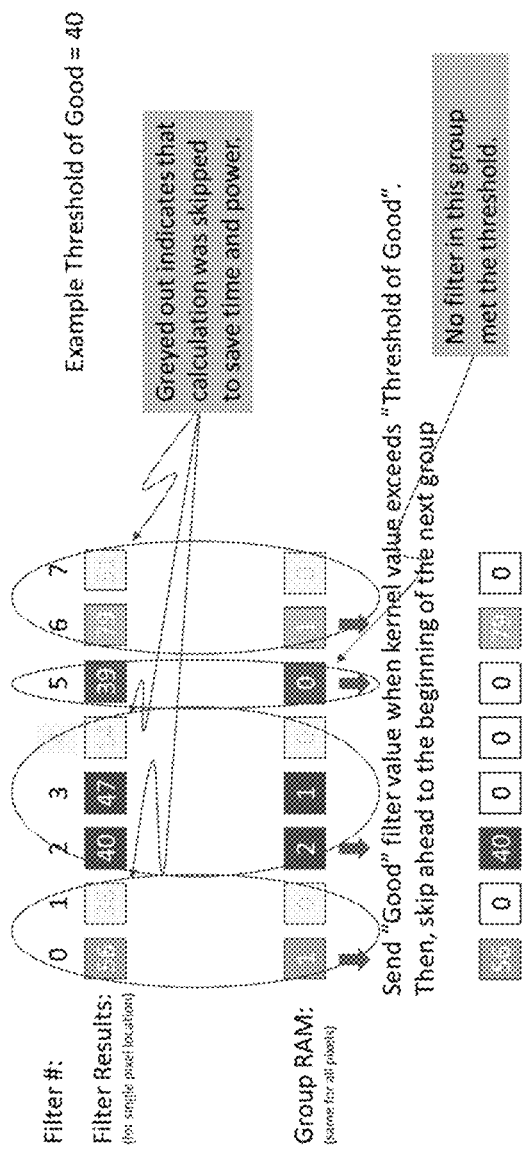

FIG. 17 illustrates is an example of K-WTA in "First Good Offer" mode.

Figure 18:
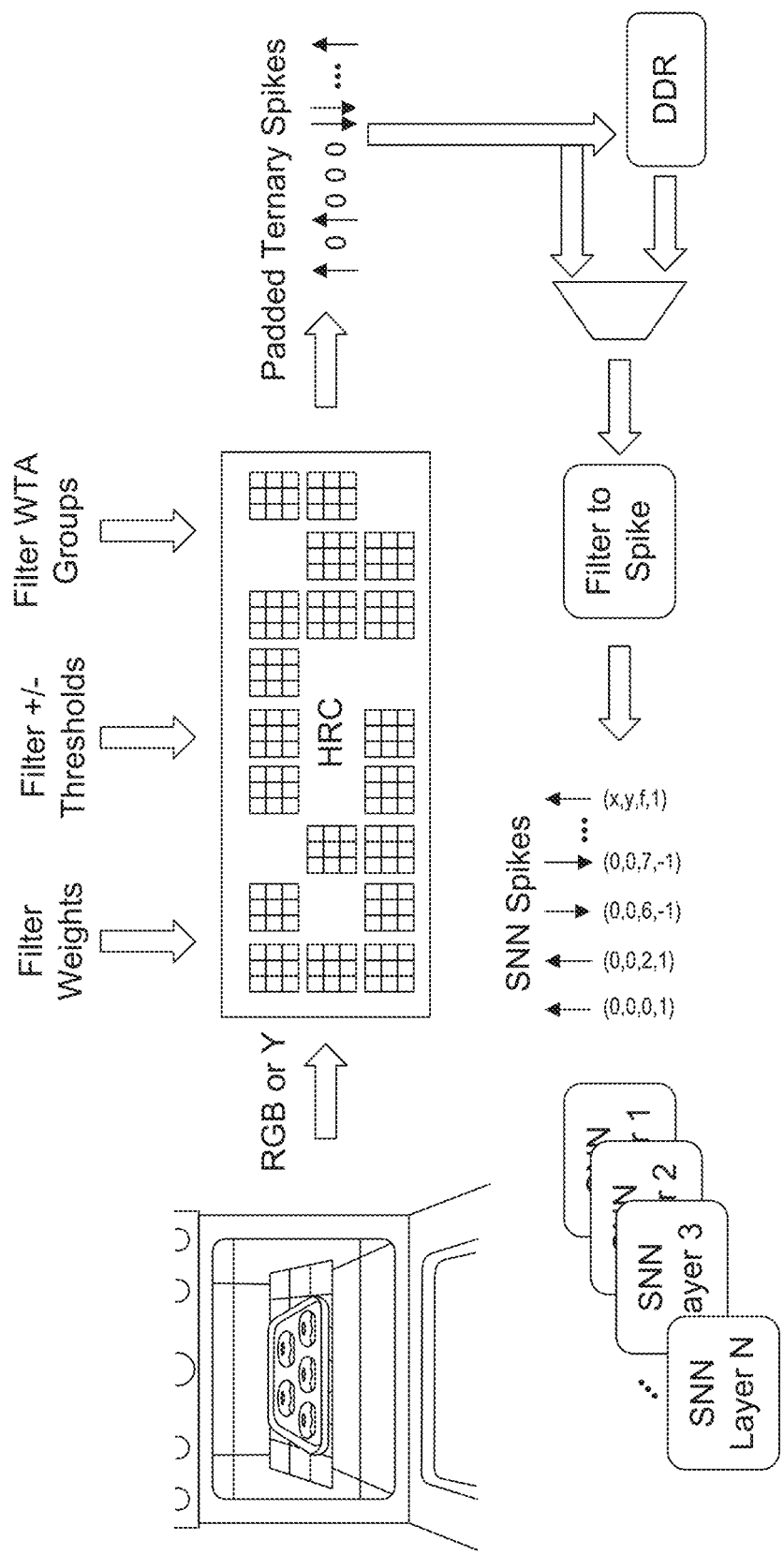

FIG. 18 illustrates how an embodiment of this scheme could fit into an SNN.

Figure 19:
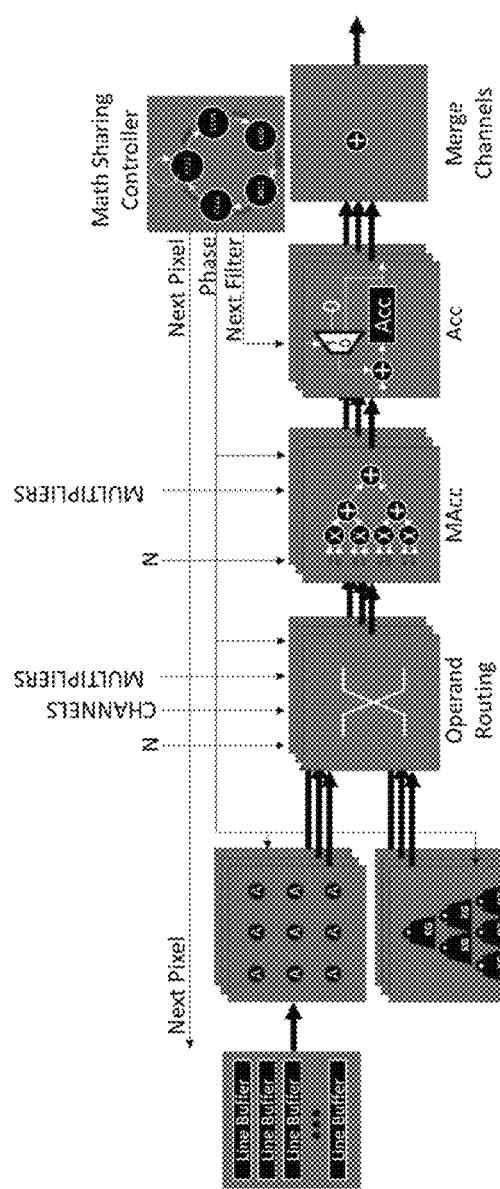

FIG. 19 illustrates the block diagram for an embodiment that generates the filter results input to the WTA block.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION OF THE INVENTION

Glossary

In this description, the memory location where a neuron's potential is incremented or decremented on a per event basis is denoted as the potential. Each neuron has a 20-bit signed potential. After neurons are fully processed, they output a neuronal activation. This activation is from 1-4 bits and is unsigned. These activations are events that are delivered to the next layer, which is stored on a different CNP. The neuron potential can be interpreted to be an unprocessed neuron state while the activation can be viewed as processed neuron state.

Activation: Activations are processed neuron states. Neurons process multiple events in a packet of events. After all events have been processed, they are converted from potentials (unprocessed neuron states) to activations via a transformation that defines how the 20-bit signed potential gets transformed to a 1-4-bit activation. This transformation is called an activation function.

DVS Camera: DVS stands for dynamic vision sensor. DVS cameras generate events which event-based processors like embodiments of the present approach can process directly. Most cameras produce frame-based images. The main advantage to DVS cameras is the low-latency and the potential for extremely low-power operation.

CNP: Convolutional Neural Processor. Each NP is a processing core in the chip embodying the present approach. Each can be either a CNP or an FNP depending on user-configuration, but not both. The CNPs perform event-based convolution or separable convolution operations.

FNP: Fully-connected Neural Processor. These processing cores are connected to inputs by the fully-connected topology.

Input Event Buffer/Input Event Buffer Memory: The input event buffer memory holds the incoming events until they are ready for processing by the current layer. The input event buffer memory can be used as a single buffer or as a double ping-pong buffer.

Inverted Kernel Format: The inverted kernel format is the format in which individual filter kernels are stored. The kernels are a 180° rotation of the original filter kernels. The inverted kernel format allows the CNP hardware to quickly calculate the address of the potential to which an event-weight product should be delivered.

Max Pooling: Max pooling is an operation that N inputs and produces a single output that has the value of the maximum input. Spatial pooling is often done only on the spatial component of convolution. When max pooling is mentioned, it refers specifically to a 2×2 max pooling implementation. A 2×2 max pooling implementation has 2×2=4 input values and a single output value. Max pooling is often used to reduce the dimensionality of a network input and therefore reduce the number of parameters and amount of computation required.

NP: Neural processor. Neural processors can be configured to be either FNPs or CNPs. The chip embodying the present approach has multiple NPs (currently 80).

Ping-Pong Buffer: A ping-pong buffer is a buffer that is broken up into two separate buffers. The first buffer (capture buffer) captures inputs as they arrive asynchronously while the second buffer (processing buffer) contains the inputs that are currently being processed by the NP. A ping-pong buffer is used to hold the input events as it allows the CNP to collect events asynchronously, as they come in. After all the current events have been processed in the processing buffer and the capture buffer has all events in the packet, the capture buffer will transfer all the events to processing buffer for processing.

Potential: A potential is an unprocessed neural state. In the NPs, potentials are stored as 20-bit signed integers. After all events have been processed, a neuron transforms a potential into an event using an activation function. It's possible that a potential does not cross a threshold to become an activation event. In this case, no event is sent.

Processed Neuron State: Another name for activation or neural activation.

Scratchpad memory: The part of the CNP memory that each of the 8 neural processing engines have to store neuron potentials as events are processed. The scratchpad memory is large enough to store 512 20-bit neuron potentials per neural processing engine. Each neural processing engine has its own scratchpad memory.

Unprocessed Neuron State: Another name for potential or neuron potential.

Introduction

This specification discloses one or more embodiments that incorporate the features of this invention. The disclosed embodiment(s) merely exemplify the present invention. The scope of the present invention is not limited to the disclosed embodiment(s).

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the present invention may be implemented in hardware, firmware, software, or any combination thereof. Embodiments of the present invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

A deep neural network (DNN) is defined as an artificial neural network that has multiple hidden layers between its input and output layers, each layer comprising a perceptron. A Convolutional Neural network (CNN) is a class of DNN that performs convolutions and is primarily used for vision processing. CNNs share synaptic weights between neurons. Neurons in a perceptron that share weight values are referred to as filters (aka kernels). Each layer in a conventional CNN is a perceptron. In the present embodiment, event-based convolution is implemented in a Spiking Neural Network (SNN) using event-based rank-coding rather than a perceptron, which has advantages in speed and considerably lower power consumption. Rank coding differs from rate-coding of spike events in that values are encoded in the order of spikes transmitted. In rate coding the repetition rate of spikes transmitted expresses a real number. CNNs process color images which are defined as: imageWidth×imageHeight× channelNumber. A color image generally has 3 channels (Red, Green, and Blue). CNNs often have many layers, so the output of a convolutional layer is the input to the next convolutional layer. Descriptions are provided as to how convolutions take place in perceptron-based CNN before discussing the event-based convolution methods implemented in the present invention and show that the result of convolution in a CNN and event-based convolution in the present invention return the same results.

Convolution

Figure 1:
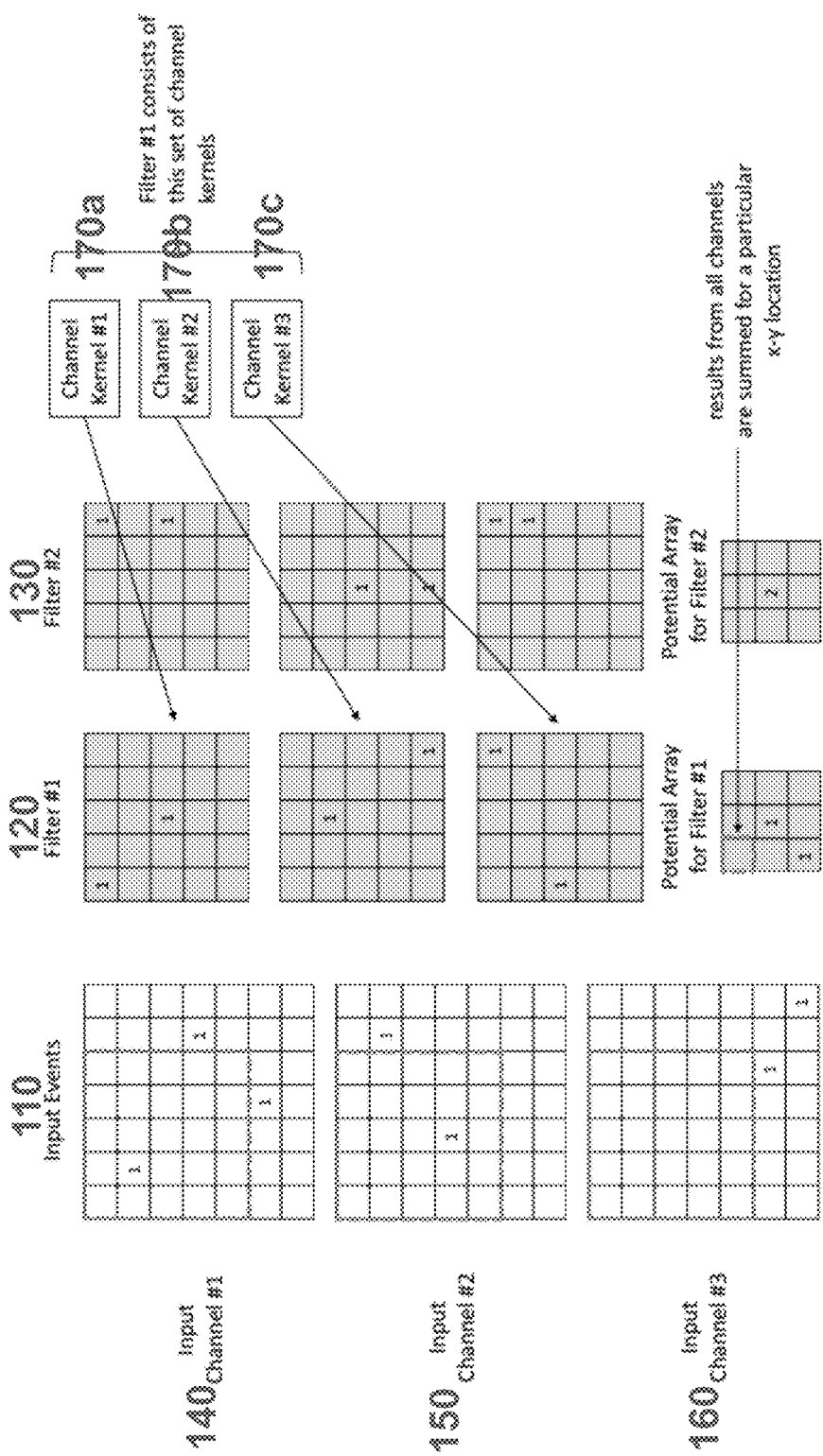
FIG. 1 illustrates a diagram of how 3-channel (red, green and blue) convolutions are performed in a conventional convolutional neural network.

FIG. 1 illustrates the convolution method 100. Two 5 by 5 filters 120, 130 out of a plurality of filters are shown. Filter #1 (120) and #2 (130) have 3 color channel kernels 170a, 170b, 170c, one for each color Red, Green and Blue from the respective input channels 140, 150, 160. The width and height of the filters are smaller than the image, with 3 by 3, 5 by 5, and 7 by 7 being the most common sizes. The filter array is moved across the image area. The results of the convolution are summed into a single value in an array storing neural potentials. The dotted outlines show where the filter #1 convolutions take place over the inputs. The smaller dotted box in the 3 by 3 potential array for filter #1 (120) shows where these inputs are summed.

One unique feature of the present invention is the absence of multiplications for the case where either the input or the weights or both the inputs and the weights are represented as ternary or 1-bit values. Values are summed and compared to a variable threshold value, which results in a spike event if the threshold value is reached or exceeded. The spike event is transmitted over an internal bus to the next layer of the network. The absence of multiplications results in a distinct speed advantage over prior art.

Figure 2:
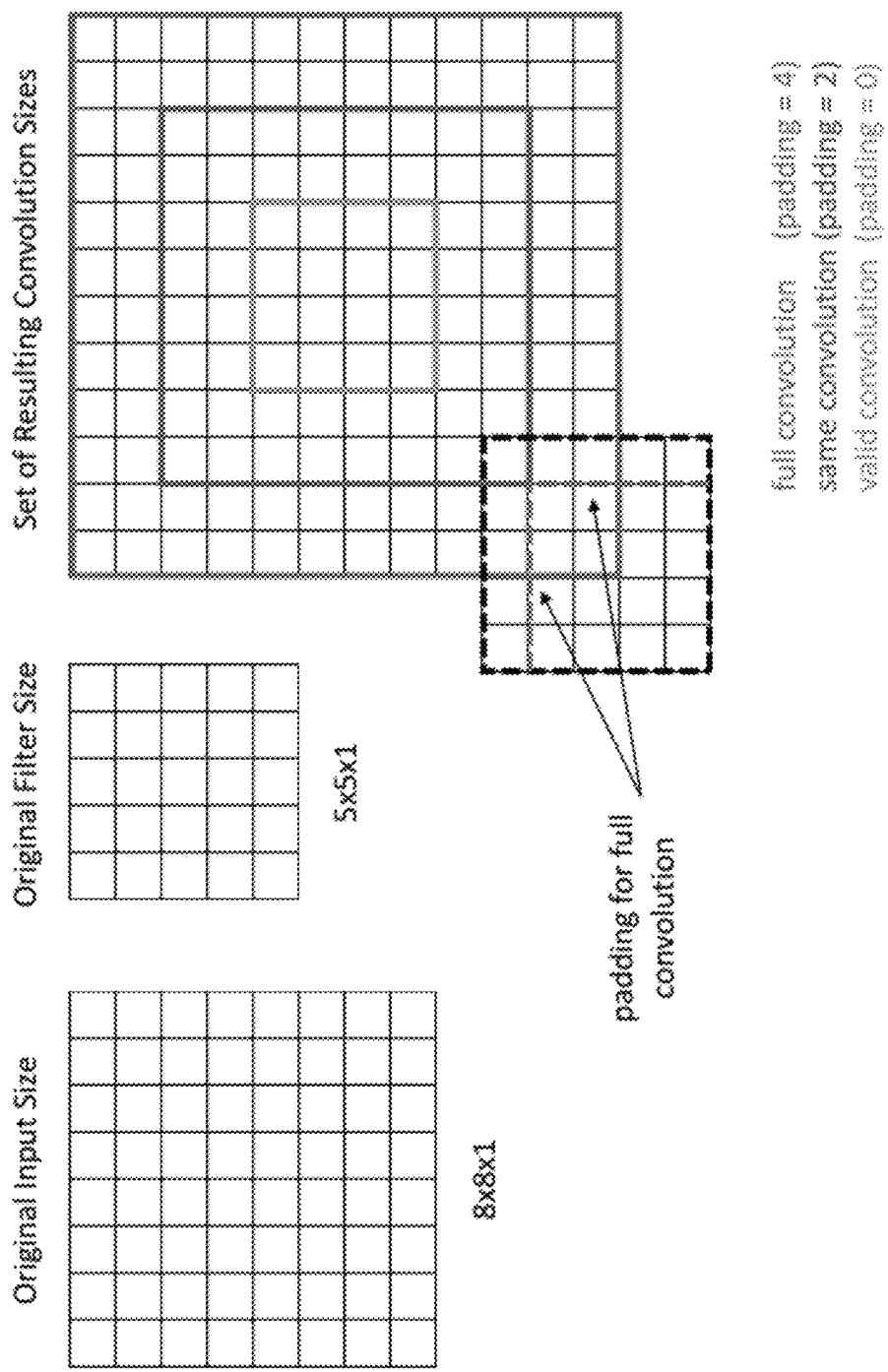
FIG. 2 illustrates an example of a 1-channel convolution for a single 5×5×1 filter.

FIG. 2 illustrates three convolution methods that are implemented in embodiments of the present invention using rank coding. In valid convolution, the resulting image area will be smaller than the original since the filter region is moved around the center of the image, leaving the edges out of consideration. In full convolution, the image region is padded with zeros, allowing the full image region including the edges to be included in the convolution. In same convolution, the edges are included, but the convoluted region is the same as the original image region.

Figure 3:
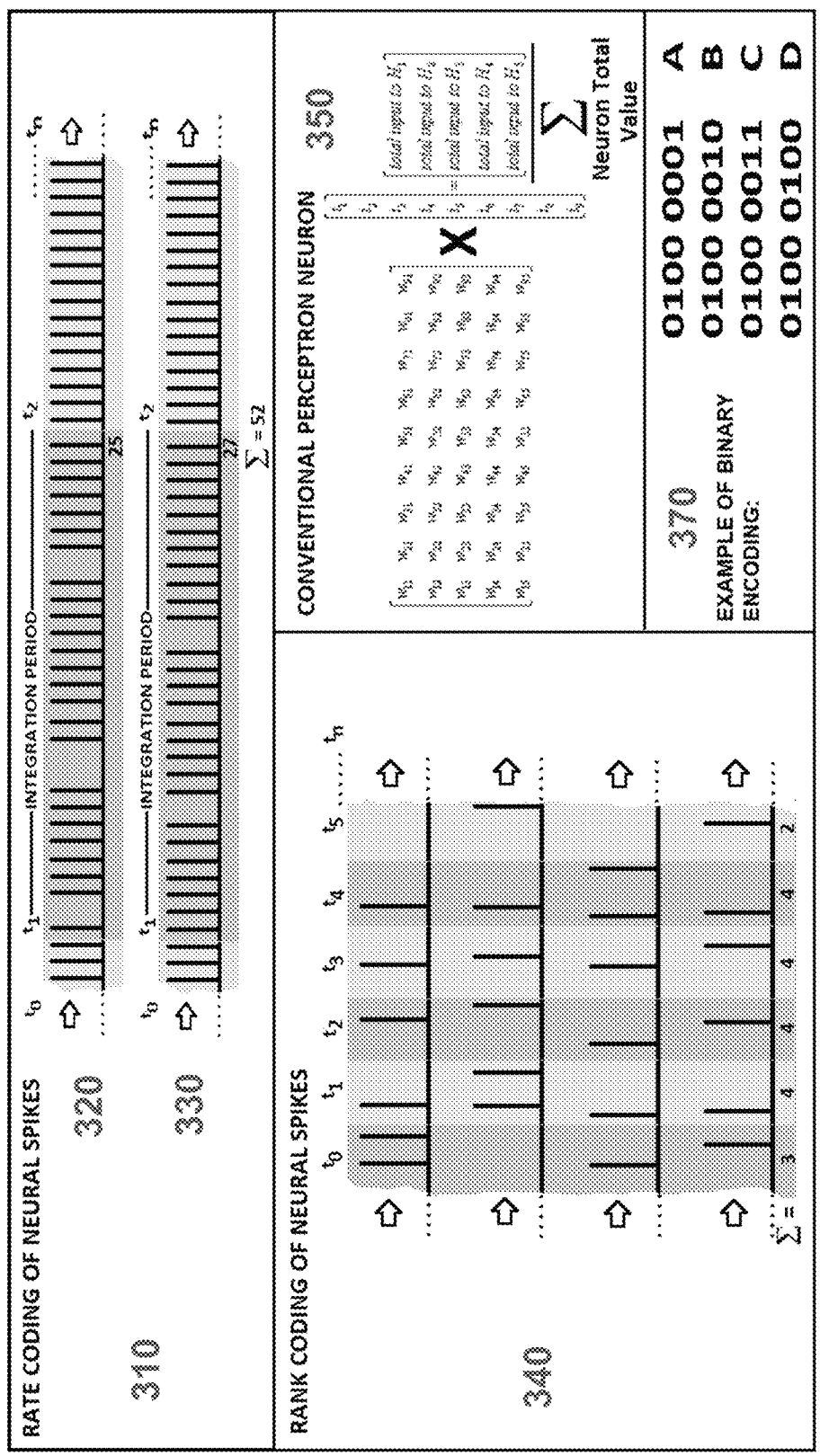
FIG. 3 illustrates the difference between rate coding and event-based rank coding.

FIG. 3 illustrates the difference between neural network spike rate coding, Temporal Spike rank coding, conventional perceptron neuron Multiply Accumulate operations (MAC) and conventional binary coding of characters in a computer system. In the present invention spike rank coding is used to perform the functions of a convolutional neural network.

Rate coding is shown in the top panel 310. The spikes received by two input synapses 320, 330 of a multitude of synapses are shown over one complete integration period labeled t1, in a plurality of integration periods. The first synapse received 25 spikes, while the second synapse received 27 spikes during this integration period. The sum of all synapses is 52, which is the simulated membrane potential of the neuron. Subsequently a non-linear function such as Tanh(n) or a linear rectifier (ReLU) function is applied to the simulated output value. The resulting output value is transmitted as a series of spikes to one or more synapses in the next neural layer. The integration time is long to allow sufficient spikes to occur to receive a value. In the lower left panel 330, rank coding is illustrated. The spikes received by four of a multitude of synapses is shown for six integration periods labeled t0 to t5. The integration time is short, and repeating spikes within each integration period are ignored. The integrated value for the first integration period is three, and four in the subsequent four integration periods. The last integration period has the value 2. These values are the simulated membrane potential of the neuron. If the simulated membrane potential reaches or exceeds a threshold value, a spike is transmitted to one or more synapses in the next neural layer. In the middle right hand panel 350, the integration method of a section of a neuron of a plurality of neurons in a conventional perceptron is shown. A collection of weight values labeled W11 to W95 are multiplied with input values I0 to I9. The resulting values are accumulated to form the neuron simulated membrane potential. Subsequently a non-linear function such as Tanh(n) or a linear rectifier (ReLU) function is applied to the simulated output value. The resulting output value is transmitted as an integer or floating-point value to one or more synapses in the next neural layer. In the lower right-hand panel 370, a conventional binary coding method is shown for reference. Binary coding schemes are widely used in conventional computer systems to encode characters and numbers. Boolean algebra is applied to compute with binary coded numbers and characters.

Figure 4:
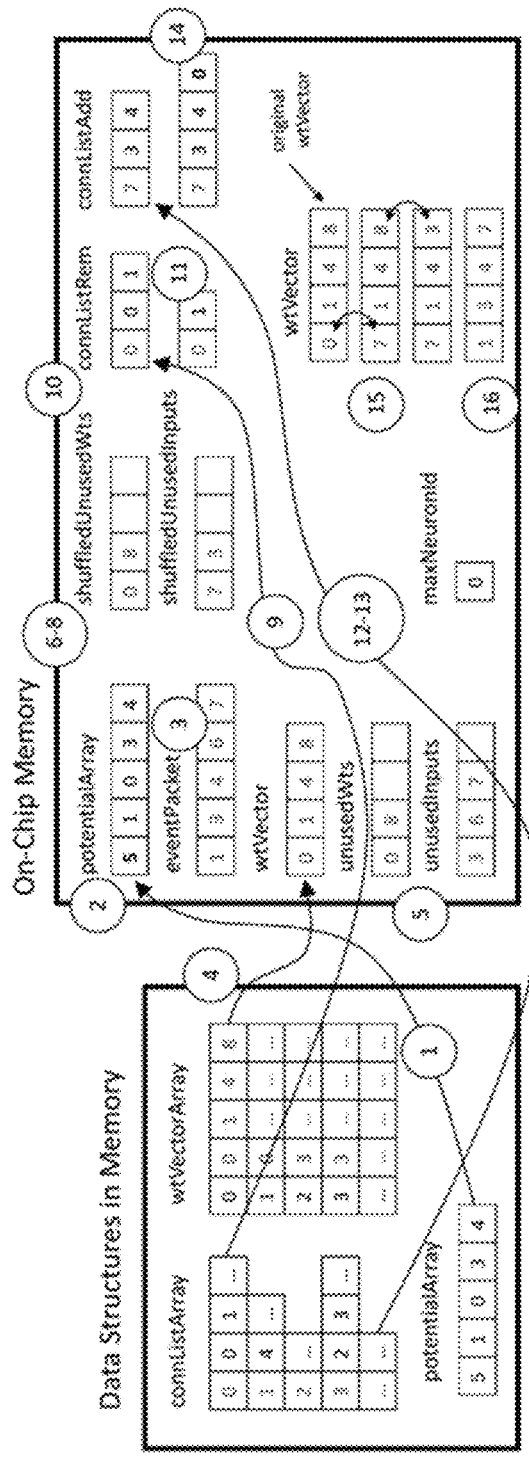
FIG. 4 illustrates the learning process in fully connected and convolutional layers.

FIG. 4 illustrates the learning method that is used in embodiments of the present invention. Two on-chip memory blocks and their content are shown. (1) An array of simulated membrane potentials of five neurons with value 5, 1, 0, 3 and 4 are loaded from data structures in memory into working memory. These values are derived from spikes that have been received by the neuron at synapses that contained weight values other than zero. (2) The neuron with a potential that is above the learning threshold is selected. In the illustration this is 5. (3) The event packet is sorted in order from low to high. (4) The packet of events for that neuron is loaded into memory, together with the relevant weight vectors. (5) An Unused-Weights entry is created in an array wherever weight vectors do not coincide with event packet values, and an Unused-Inputs entry is created in a second array wherever an input event has an associated zero weight value. (6) both Unused-Inputs and Unused-Weights arrays are shuffled to create randomness in the learning rule. (7) The first position in Unused-Inputs and Unused-Weights is selected. (8) after which the next entry in Unused-Weights and Unused-Inputs array is selected, this process is repeated until all entries have been iterated. (9) The connection-list array is loaded into working memory and (10-11) the connection list array is iterated to remove the ID of the neuron with the maximum potential. (12) unused spikes are spikes that have an associated weight value of 0. (13) The unused spike location is swapped with an unused weight value (14-15) after the neuron ID is added to the connection list. The weight vectors are stored in a sorted format (16).

Figure 5:
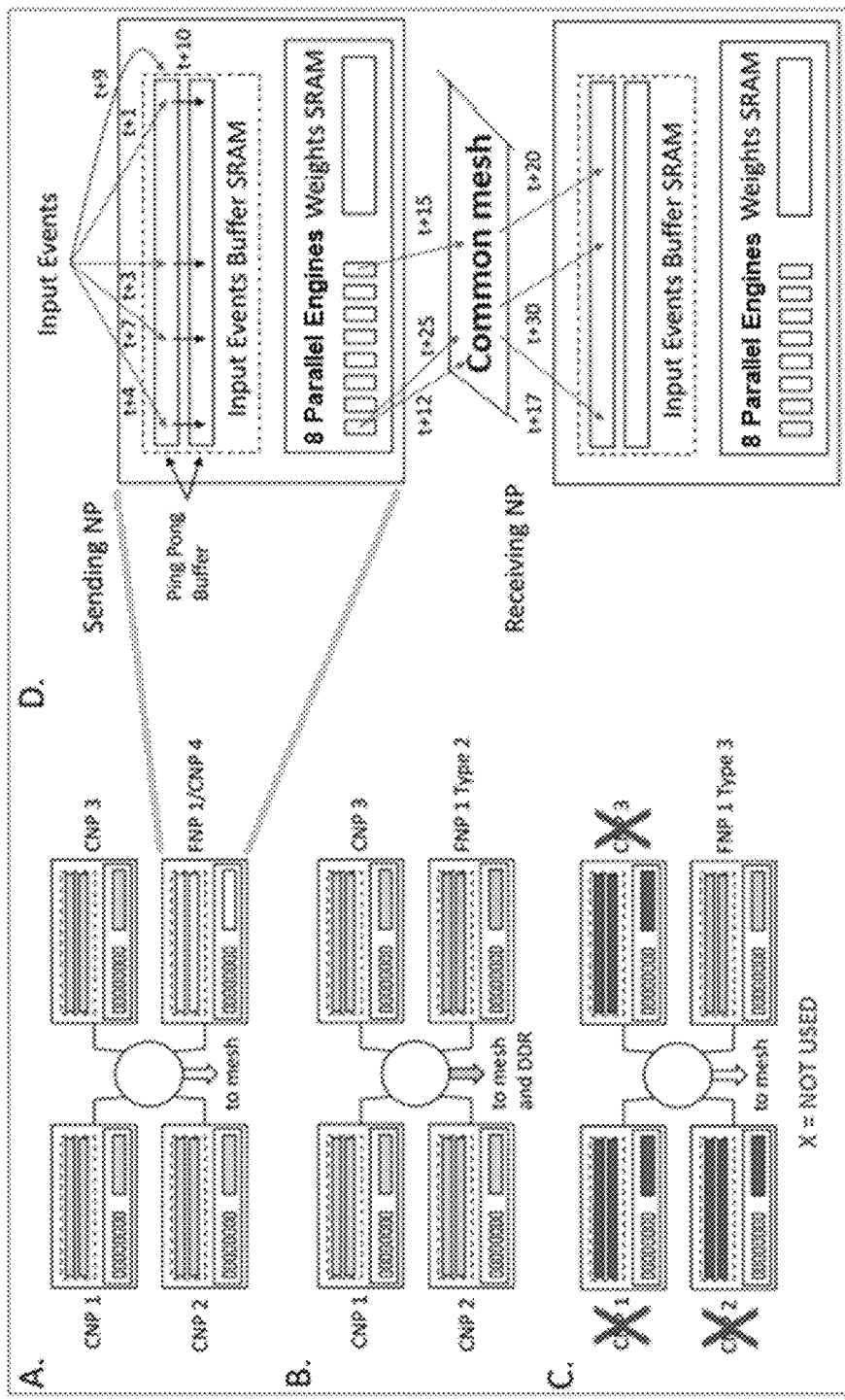
FIG. 5 illustrates three different user-configurable modes of convolutional neural processors and fully connected neural processors.

FIG. 5 illustrates the organization of neural processors (NP). Each neural processor is comprised of a plurality of neurons and a second plurality of synapses. (A) Four neural processors are in a group consisting of three Convolutional Neural Processors (CNP1-CNP3) and one Fully Connected Neural Processor (FNP1) that may be configured during initialization as the fourth CNP (CNP4), or (B) as a fully connected neural processor with limited connectivity (type 2). Type 2 FNP connectivity can be increased using off-chip DRAM. In yet another configuration (C) (type 3) the FNP will use all of the resources of the CNP within the same group. In this case, the FNP will not need to use any external memory which is beneficial in stand-alone applications. A plurality of groups communicates over a common network on a chip, called the mesh illustrated in (D). Input events are placed in a dual buffer (ping-pong buffer) whereby one buffer is processed while the other buffer is filled. Each NP has 8 parallel engines that update a plurality of neurons and a plurality of synapses in parallel. Synapse weights are stored in the Weights SRAM that is on-chip. Each of the 8 parallel engines also communicates with the common mesh bus. The address of the neuron is placed in a packet on the bus when a neuron generates a spike or transmits a potential to the next NP. At the receiving NP, the packet is received into the Input Events Buffer SRAM also named the Ping-Pong buffer for processing by that NP. The t+n (whereby n is a value) in the image indicate the timing of events; t+30 indicates that the information is received in the buffer at time t+30 cycles, where the values are stored in the buffer at time t.

As is known in the art, deep neural networks (DNNs) have become a popular choice for tasks such as image classification, face recognition, and the like. However, the typical implementation has resulted in the need for massive computations on von Neumann architectures, which use substantial energy and require large areas. Consequently, efforts have seen a shift away from conventional digital hardware to implement neural algorithms, including various types of special purpose hardware. However, prominent among the challenges of special purpose hardware is the need for scalability, efficiency and power consumption.

In deriving an innovative architecture in response to these challenges, the inventors identified at least three contributions: (a) event based operation, (b) design of the of the hardware, which controls how much information is pushed through, and thereby controls the accuracy and power consumption of the process, and (c) design of the actual procedure and the precision/bit numbers for the weights and activations in the neural network so that less memory space is used.

The choice of the number of bits is one important consideration in the design of the layers in neural network architecture. The default number of bits commonly used in neural networks is 32 bits, with multipliers being 32 bit by 32 bit. Lesser bits may be used, with a resulting smaller power consumption and chip area required, but with a loss of accuracy. Thus, a 1 bit×1 bit multiplier would represent the lowest limit on bit choice. Initial experiments have shown that a 92% accuracy is achievable using ternary weights. Experiments by the inventors have also shown that a 4×4 bit multiplier provides a sweet spot in terms of relatively low reduction in accuracy (compared with the traditional 32 bit×32 bit approach), while not significantly increasing the power consumption and chip area requirement over that required for a 1 bit×1 bit solution. The sweet spot choice results in a reduction by a factor of 3 to 4 in the number of overall parameters used. In various embodiments, the number of bits used may be different on different layers, i.e., in these embodiments, a layer by layer choice of the number of bits to use (1×1, 2×2, 4×4 etc.) may be made.

In order to make advancements in a hardware-only implementation of a spiking neural network, the inventors sought to reduce the operation count. In various embodiments, the approach is event-based, and the spikes are encoded, rather than every single convolution stride. Spikes occur only when there are activations, and since events are processed only when spikes occur (rather than upon every convolution stride), there are far fewer events. Since there are fewer events, this results in fewer operations. In a typical embodiment of the present disclosure, the operation count may be reduced by a factor of 3 or 4 by adopting the innovative approach.

In a further innovative advancement, the inventors sought to use a particular convolution type that requires fewer parameters (e.g., weights). Since these parameters require storage in order to perform the necessary neural computations, a reduction in the requirement of physical memory entries results. Although the calculations involved in such a separable convolution are more involved, the additional calculations are manageable and lead to a substantial reduction in the number of parameters, and associated physical memory entries. Such a reduction in the number of physical memory entries enables a much larger neural computational capacity to fit within the given RAM area of a particular chip.

Conventional neural network implementations typically require substantial memory (e.g., SRAM) to save the potential value at each neuron. With the large number of neurons in a typical neural network, the majority of available memory (e.g., SRAM) is used to save potentials associated with the neurons. Consequently, the total number of neurons available in a hardware implementation of an SNN neural network is ultimately limited by the available memory (e.g., SRAM). In order to make advancements in a hardware-only implementation of a spiking neural network, the inventors sought to use memory differently by saving the activation levels, rather than the potential. The magnitude of activation levels requires typically 12 to 20 bits to capture their value, while a spike may be captured in only 1, 2, or 4 bits. This resulting six-fold reduction in bit requirements substantially increases the effective storage capability.

Conventional implementations of neural networks perform the computations in the network by following its structure, one layer at a time. This approach produces a large amount of intermediate data that are steadily output to memory as the computation progresses. Upon completion of a layer, the intermediate data are sent back to the same computational hardware, and the process repeats until computation in all layers has concluded. The amount of intermediate data that must be transported between the computational hardware and memory increases with increasing neural network size. In an additional advancement, the inventors have employed fusion of the computation across multiple layers. Rather than processing each layer to completion before proceeding to the next layer, the inventors have restructured the computation such that multiple layers are computed together, which avoids the need to store or retrieve the intermediate data from the memory. In short, fusing takes the operations of two or more layers and fuses them into a single operation.

Quantitative Metrics of New Approaches

Turning now to a quantitative evaluation of the improvements, a description is provided of three areas of quantitative improvement: (1) the efficiency of the storage of the representation of a "neuronal potential" within the convolutional neural processor (CNP); (2) the approach to event-based convolution algorithm; namely the filtering of events, ordering of filters, and individual application of increments or decrements to neuronal potentials; and (3) a new unsupervised learning algorithm for convolutional operations in neural networks.

Figures of Merit for Efficient Neuron State Storage on CNPs

Before describing the details of how neurons are stored on CNPs, various terms and the approach by which CNPs process events are described. The memory location where the value of a neuron potential is stored is incremented or decremented on a per-event basis is known simply as the potential. By way of example, each neuron may have a 20-bit signed potential. After neurons are fully processed, they output a neuronal activation. Again, by way of example, this activation may be from 1-4 bits and is unsigned. These activations are events that are delivered to the next layer in the neural network, which is stored on a different CNP. The neuron potential can be interpreted to be an unprocessed neuron state while the activation can be viewed as processed neuron state. If the input to a particular CNN layer has dimensions M×N×C, where M is the height of input, N is the width of input, and C is the number of input channels of the input and the dimensions of the filters are H×W×C, (H and W are filter height and width) and there are F filters in the layer, then the total number resulting potentials (and therefore activations) is M×N×F. One important innovation by the inventors is that a small number of 20-bit signed potentials are temporarily stored in the CNP, where the layer resides, while all activations are stored in the CNPs where these activations will be delivered as events to target layers. Because only a small subset of the 20-bit potentials are stored, a neuron state may be stored at a very high density.

Figure 6:
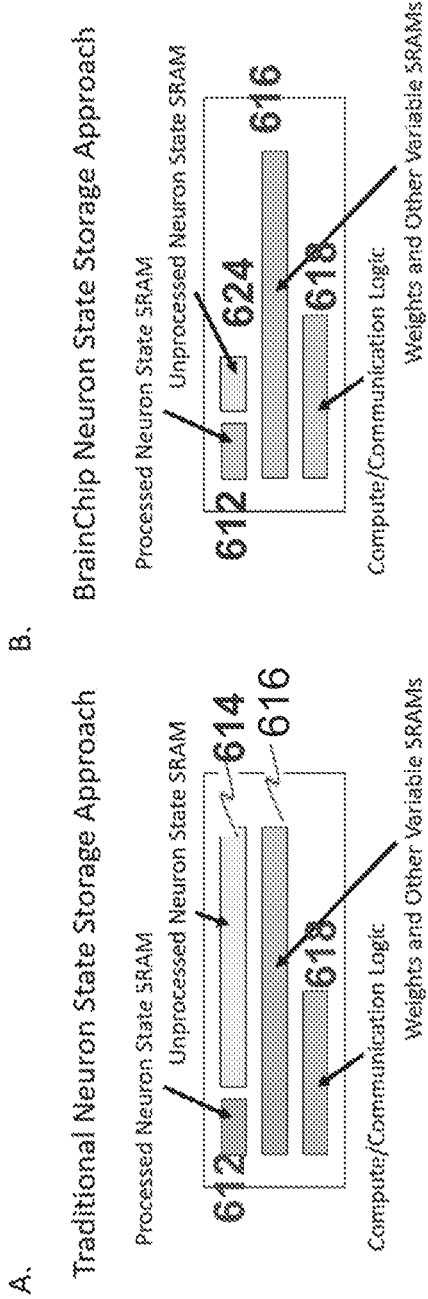
FIG. 6 is a high-level description of a traditional neuron state storage approach that may be contrasted with the innovative neuron state storage approach of certain embodiments of the present approach.

FIG. 6 is a high-level description of a traditional neuron state storage approach that may be contrasted with the innovative neuron state storage approach of certain embodiments of the present approach. Broadly speaking, the entirety of the unprocessed neuron state is not stored at one time when processing a single input, but rather a small subset of it at one time. The subset of unprocessed neuron state that gets stored is then overwritten with new unprocessed neuron state until all computations associated with the input data are completed. By taking this approach, the amount of memory used to store unprocessed neuron state with the present approach in FIG. 6B is less than the amount of memory used in the traditional approach in FIG. 6A. The same number of unprocessed neuron states can be processed using the hardware implementation of the present approach.

Turning now to a description of the neuron state memory management approach in greater detail, there are three main operations that must be performed for a packet, or collection of events, to be fully processed. The first two operations occur for each event. The third operation occurs for each neuron. Before processing, the events are sorted by the neuron. For each event, if the weight value or activation are both greater than ternary, the event value must first be multiplied by the weight value (step 1) (multiplication operations are not necessary when 1 bit or ternary bits are used) and the resulting product must then be added to the potential that corresponds to the neuron being computed (step 2). Third, each potential value is exposed to a unique function that transforms the 20-bit signed potential to a 1-4 bit unsigned activation (signed in the case of ternary activations). Next is a description of when and where a neuron state is stored for each step.

FIG. 7A an exemplary approach by which each CNP processes events. In a particular example, each CNP has 8 neural processing engines that run in parallel. The memory within these neural processing engines is used to store the potentials and is reused. Steps 1-3 are done across the 8 neural processing engines per CNP. A small subset of the total events are processed at the same time across the 8 neural processing engines. During this time, each of the 8 neural processing engines has enough memory to store 512 20-bit signed potentials. This memory is referred to as neural processing engine scratchpad memory. The combined scratchpad memory (green rectangles in FIG. 2B) across all 8 neural processing engines is then 512*20*8=81,920 bits. This means that each neural processing engine processes 512 neurons at a time. After 512 neurons have been processed, the neural processing engines place the 1-4 bit activation events on the mesh to be delivered to the CNP that is running the layer these events are connected to. The 1-4 bit activation events are routed to the target CNP and stored in this CNPs input event buffer memory (blue rectangles in FIG. 2B). The size of the input event buffer memory is 344,064 bits. Therefore, the total amount of memory per CNP used to store all neuron state is 81,920 bits+344,064 bits=425,984 bits. As one of ordinary skill in the art would appreciate, the above numbers are exemplary rather than limiting values of embodiments of the invention.

Figure 7:
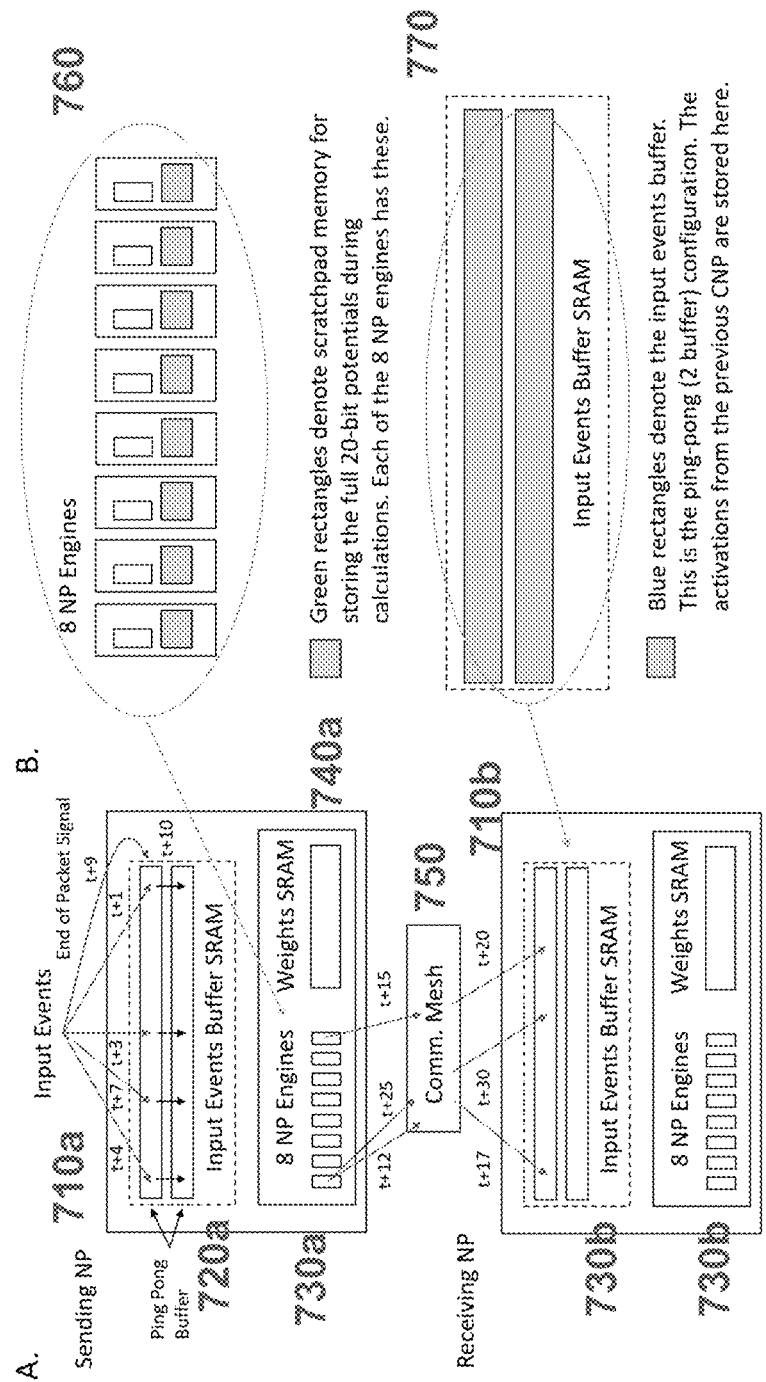
FIG. 7 illustrates an exemplary approach by which each CNP processes events.

FIG. 7 is also an example of how a CNP processes events (in ping-pong buffer mode). The external facing buffer (top box in input events RAM) of the ping-pong buffer places incoming events (blue arrows) in their corresponding place as they come in from the mesh. An 'End of Packet Signal' (red arrow) is eventually received, causing the events (black arrows) to be moved from the external facing buffer to the internal facing buffer (bottom box in input events RAM). These events are processed by the 8 NP engines. Output events (green arrows) are placed on the mesh for routing to the next NP as soon as they are calculated, so there is no need to store 20-bit potentials. The time units are arbitrary and just meant to show the order of when things are occurring.

A useful figure of merit, the total number of neurons that can be represented per unit memory, may be used to capture the quantitative benefit of the advancements of various embodiments of the present approach. A neuron is defined to be represented if both its unprocessed state (potential) and processed state (activation) are stored in the memory (e.g., on-chip memory) at some point in time during the event-processing calculation. By memory, only the memory dedicated to holding the neuron state is being referred to, not the entire on-chip memory.

In computing various scenarios for the figure of merit, two considerations should be acknowledged, as part of the calculation of the figure of merit. First, in these exemplary calculations, activation events can range from 1-4 bits in size. Second, CNPs may be configured to use a single-buffer input events buffer or a double-buffer (aka ping-pong) input events buffer. Single-buffers can handle double the number of events that double-buffers can handle at the cost of an increase in latency. With these two considerations in mind, a high-end neuronal density scenario and a low-end neuronal density scenario may be formulated.

In the high-end neuronal density scenario, activation events are only 1-bit and a single-buffer input events buffer is being used. This means the entire input event buffer memory can be dedicated to storing 1-bit activation events, which means 344,064 neurons may be represented. However, the cost of the scratchpad memory needs to be included when the total memory being used is calculated. The ratio of neurons to memory in the high-end neuronal density scenario is then:

Neurons Represented/Unit Memory=(344,064 Neurons)/(425,984 bits)=(344,064 Neurons)/(425,984 bits)=0.81 Neurons/bit In the low-end neuronal density scenario, activation events are 4-bits and a double-buffer input events buffer is being used. The double-buffer means that only half the amount of input event buffer memory is available as was the case for the single-buffer case. Replacing 1-bit activations with 4-bit activations also means a requirement of 4-bit storage for each activation instead of 1 bit; which reduces the total number of activations that can be stored by a factor of 4. The total number of neurons able to be represented per unit memory is reduced by a factor of 8:

Neurons Represented/Unit Memory=(344,064 Neurons)/(8*425,984 bits)=(43,008 Neurons)/(425,984 bits)=0.10 Neurons/bit The range of values for these two scenarios is 0.81-0.10 Neurons/bit. Were one able to use a smaller scratchpad memory and/or potentials that are smaller than 20 bits along with 1 bit activations, then one could presumably achieve even higher densities. It seems that the practical neuron density limit for embodiments would be close to 1 neuron/bit if no compression was used to store the activations. In this scenario, one would calculate the potential for a neuron one at a time and have a single register as the scratchpad memory. The theoretical limit could be greater than 1 if some type of compression was utilized. However, the computational cost of encoding or decoding the activations would potentially outweigh the benefits.

In various embodiments, memory may be realized by various types of memory including volatile SRAM, as well as non-volatile memory technologies.

Figures of Merit for Event-Based Convolution

The next figure of merit captures the advancement of the event-based convolution in the CNP. The CNP is designed to process events and increment (or decrement) the corresponding potential in the scratchpad memory of each neural processing engine in an efficient manner. To ensure that the events can be processed quickly and in parallel by the neural processing engines, a number of optimizations have been integrated into various embodiments of the present approach.

Figure 8:
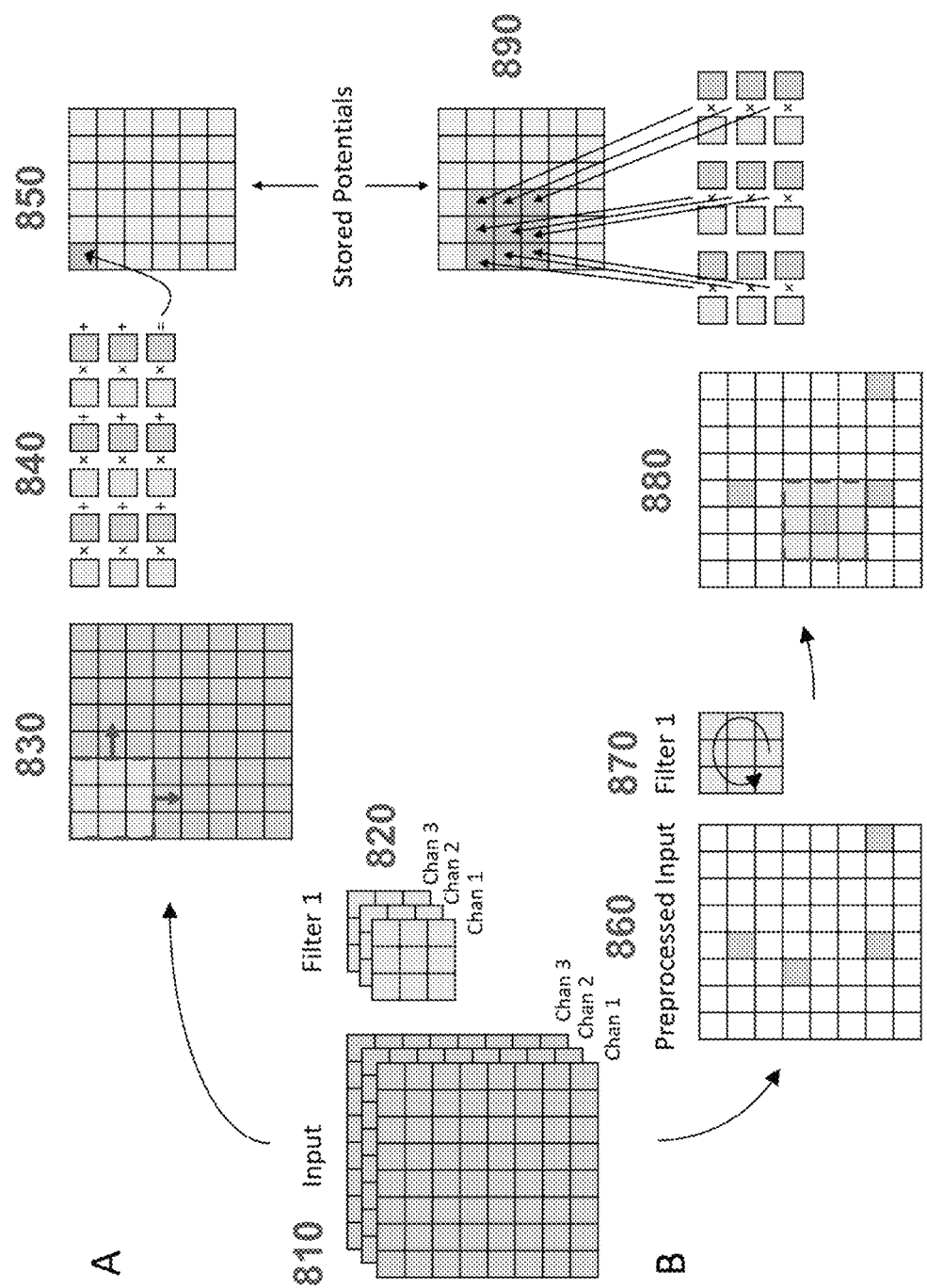
FIG. 8 shows a comparison between the traditional convolution algorithm and the new event-based convolution algorithm.

FIG. 8 shows a comparison between the traditional convolution algorithm and the new event-based convolution algorithm. In FIG. 8A, all entries must be computed, even if their values are zero. The convolutional filter (blue) is 'slid' across the inputs. Note that all contributions to a given potential entry are computed at once in the traditional convolution algorithm. FIG. 8B shows the event-based convolution approach. The frame-based image must be converted into an event-based image first. This can be done by preprocessing or by a dedicated spike encoding area on the chip using the new event-based convolution algorithm. Event-based images from DVS cameras can be directly processed by the algorithm. The gray entries in the preprocessed input are events that must be processed. Note that the number of computations event-based convolution must perform is directly proportional to the number of events (gray squares). The term event sparsity is the ratio of events to pixels as the event sparsity. Note that not all contributions to a given neuron's potential are computed at the same time. Two events may affect the same neuron, and therefore all events must be processed before the event-based convolution computation may be termed complete.

In FIG. 8, it is assumed that the input is a frame-based image. The gray input squares indicate entries that must be computed. Computations are only shown for a single input channel. Part A shows that a traditional convolution must compute every entry in the input by sliding the weight kernel (in blue) across the input images. The light orange squares indicate entries in the potential array, with the darker orange entries corresponding to entries being computed currently. Part B shows the event-based convolution. First, note that frame-based image must be converted to an event-based image via preprocessing. The filter must be rotated by 180°. This allows the hardware to deliver the product of the weight and the input to the current potential location. In this picture, only 4 of the calculations shown in the figure are necessary for the event-based convolution.

Next a description is provided of the process by which an event-based convolution is performed and then describe the key innovations. Note that in this description, the terms "event" and "spike" are used synonymously. Also, recall that events are composed of four pieces of information: the x location of the event, the y location of the event, the channel of the event, and the 1-4-bit value of the event. Events are organized into groups of events called packets.

The Event-Based Convolution

An overview of the architecture of an exemplary convolutional neural processor (the basic unit of processing) includes the following blocks: (1) inbound filter block, (2) packet collection block, (3) filter memory and kernel, and (4) convolution operation. Prior to these blocks there is a spike converter that takes the input data in its native format, and converts it to spikes that may be processed by the subsequent blocks.

The purpose of the first block, the inbound filter block, is to select the spikes of interest for each neuron. Each neuron has a particular portion of an input for which it has an interest, and therefore it activates only when a spike is within its zone of interest. In a color image, an embodiment of the filter for each neuron may have three RGB channels.

The packet collection block accumulates the input spikes over time until there are sufficient spikes to form a packet to process. A packet is a collection of events (spikes) of a fixed predetermined size. Included with the packet collection block are memory, which may be in the form of SRAM or other memory, in which to store the packet as it is being formed. A packet is a collection of events of fixed size, pre-defined. Within the memory, the events (spikes) are organized by channel (e.g., RGB in the case of color image data) and sorted by two-dimensional coordinates. In other words, the events (spikes) are accessible based on a C, I, J index, where C represents a channel, and I, J represents indices into the two dimensional spatial coordinates of the image data.

The next block has the filter memory and kernel, where the filter memory stores the weights (parameters) for the convolution operation.

The next block performs the convolution operation, including the summation, to provide the final result. In an embodiment, the convolution uses an efficient hardware implementation, with a resulting reduction in memory requirement and also a reduction in the number of neurons necessitated on a layer within the neural network. Such reductions result in the fan-in and number of filters forming the overall limitations of the network.

The efficient hardware implementation is made possible by the order in which the data from an input packet is provided. This order enables each calculation to focus on a row-by-row calculation. Thus, the net effect of this efficient ordering is that following the completion of one row, the next stride in the operation is one row down. Thus, rows may be reused for the next input row spikes. The net effect is that the top row is no longer needed in the computation, and therefore only a small amount of memory is necessary for storage of the potential. In summary, instead of having to store the entire set of potentials, the ordering means that only storage for one buffer is needed, which is a big reduction in the memory requirement at each convolution neural processor. The result from one computation is then forwarded to the next convolution neural processor.

Figure 9:
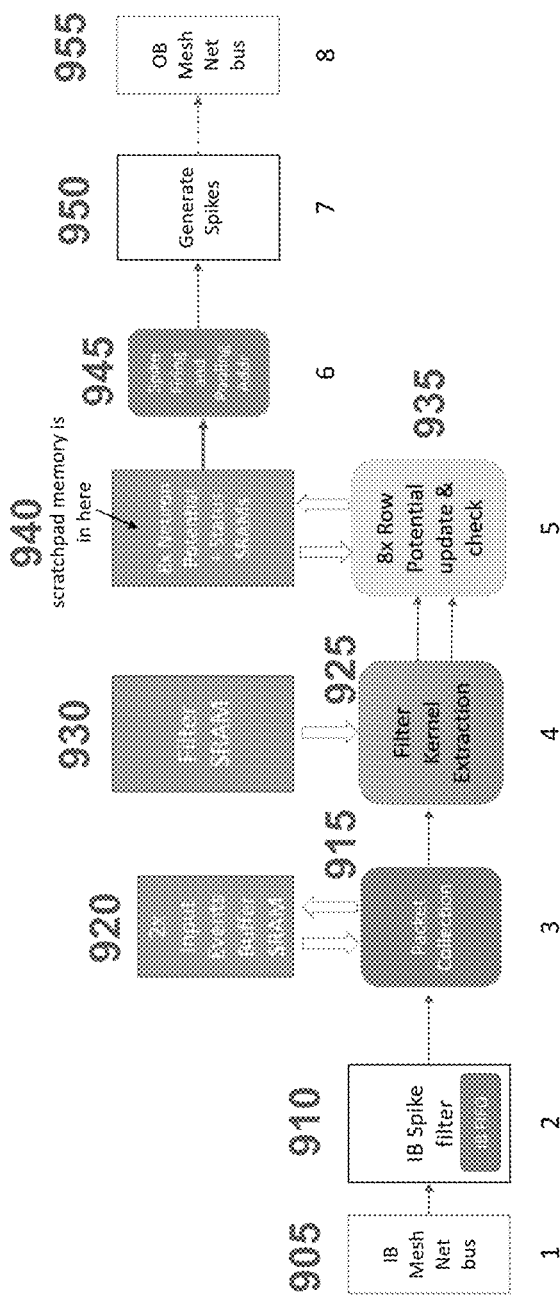
FIG. 9 illustrates the main steps to process spikes in a packet, in accordance with an event-based convolution.

More details are illustrated in FIG. 9, which shows the main steps to performing an event-based convolution. In step 1, the inbound (IB) mesh delivers events from other cores. Events are filtered out if the x, y location is not found on the current CNP in step 2. If the event x, y location does belong to the CNP, then its x and y coordinates are transformed to local CNP coordinates when necessary. In step 3, all events are collected until an end of packet (EOP) signal is received. When the EOP signal is received, the input events buffers (if ping-pong buffers) are swapped. Note that the second part of the pooling operation (row pooling) is also done on this step. Column pooling was done before the events were sent. Both row and column pooling are only done when the max pooling operation is associated with the output of a particular layer. Thus, some layers perform pooling operations while others do not.

In step 4, the channel of the event is read and is used as an offset address to index into the filter SRAM (where the weights are stored). Next, all filter kernels corresponding to the event's channel are copied from the filter SRAM memory. This can be done because of how the filters are arranged in the filters SRAM. This is shown in FIG. 10.

Figure 10:
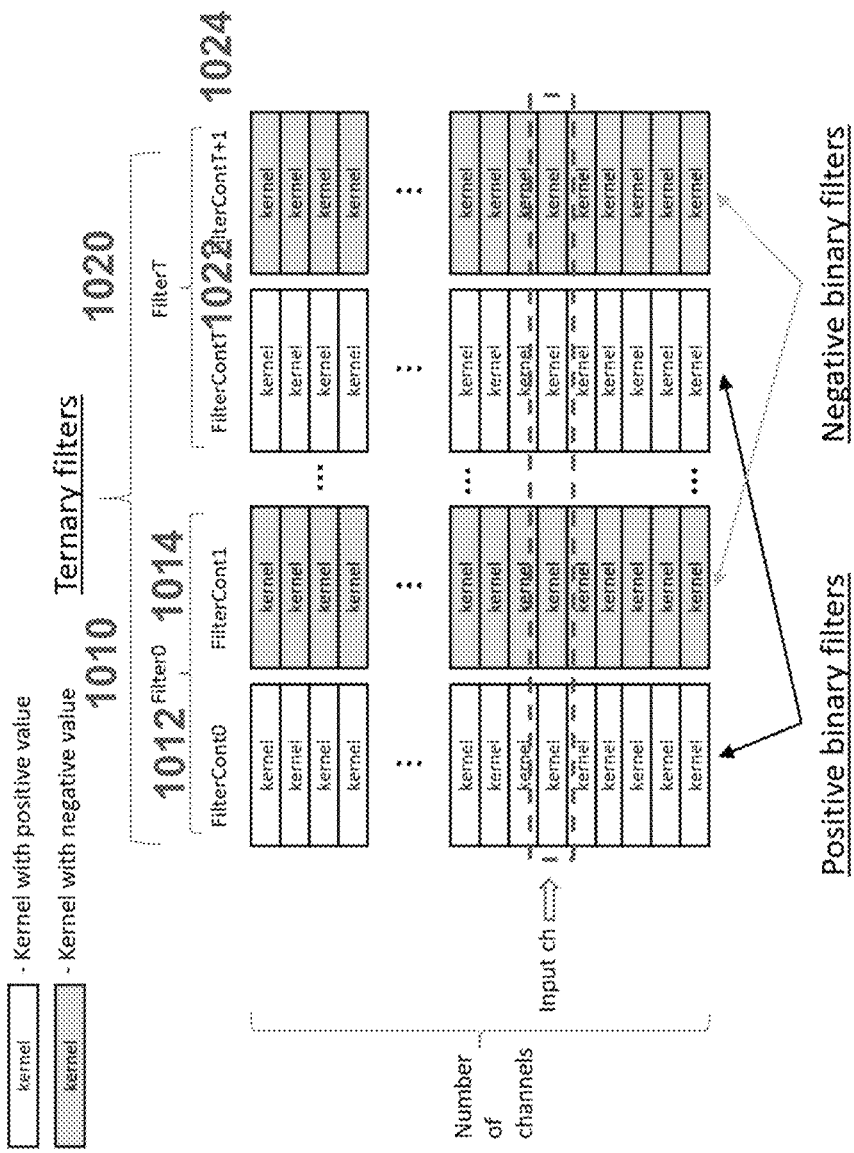
FIG. 10 illustrates a filter SRAM layout example for ternary filters or binary filter configurations.

In FIG. 10 is a filter SRAM layout example for ternary filters or binary filter configurations. For both ternary and binary filters, positive and negative values are separated into different filters. The same is true for multibit filter values (not shown). The important thing to note is that the filters, which contain the weights for the neural network, are arranged by channel in the filter SRAM memory. This configuration allows the hardware to quickly index (find) the correct filter kernels based only on the input channel. Because the filter kernels are arranged contiguously in memory, they can be efficiently copied to the neural processing engines for the convolution calculation.

Because filters may be spread across multiple CNPs, the start and ending filter indices are calculated. Each neural processing engine processes a single filter at a time. Thus, the first 8 filters in the CNP will be processed by the 8 neural processing engines. The 8 neural processing engines now have the appropriate filter kernel addresses and can perform the following operations in step 5:

1) Each neural processor initializes (zeros out) potentials in scratchpad memory. The scratchpad memory is arranged in 8 rows of 64 columns, leading to the temporary storage of 512 20-bit potentials. Potentials in scratchpad memory are arranged in row major order, so column entries are contiguous in memory.

2) Input events are read from the input events buffer in x, ch, y order. This allows the neural processing engine to process all the events related to a single potential at a time.

3) Neural processors begin processing events. Each engine:
   a. Gets the first event's channel and loads the 1×1, 3×3, 5×5, or 7×7 kernel that corresponds to:
      i. the filter the current neural processing engine is working on
      ii. the channel from the event.
   b. Then finds the rows of the kernel that are non-zero.
   c. Loads a single non-zero kernel row
   d. Calculates the potential and output event SRAM addresses of each row using the inverted kernel format (see FIG. 6).
   e. Multiplies all kernel row elements by event value (1-4-bit value)
   f. Increments the corresponding potentials by the product using addresses from part d.
   g. After all events have been processed for the current filter, transform potential to an output activation (event)
   h. If the output activation is non-zero, update the status fire array with a true or 1 entry. This array is a list of neurons that have fired and whose activation values must be sent to the next layer.

Figure 11:
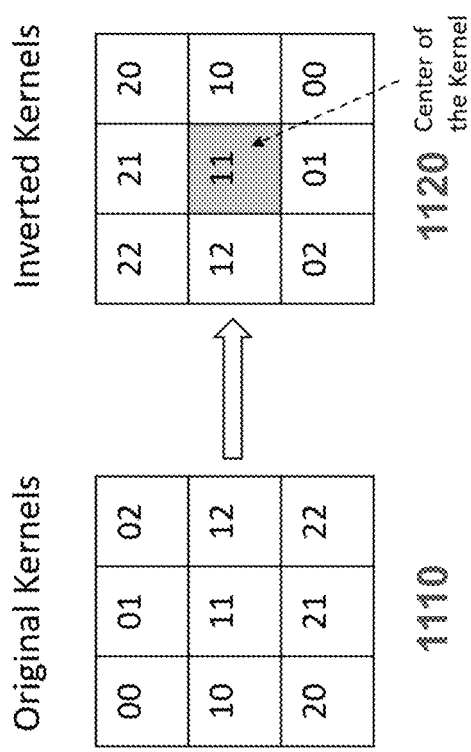
FIG. 11 illustrates inverted kernels.

FIG. 11 illustrates inverted kernels. The neural processing engines use the inverted kernel element positions with the event's local x, y coordinates to find the address of the potentials that must be updated. The filter kernels must be stored in the inverted kernel format to allow the neural processing core to quickly calculate the potential's address.

Figure 12:
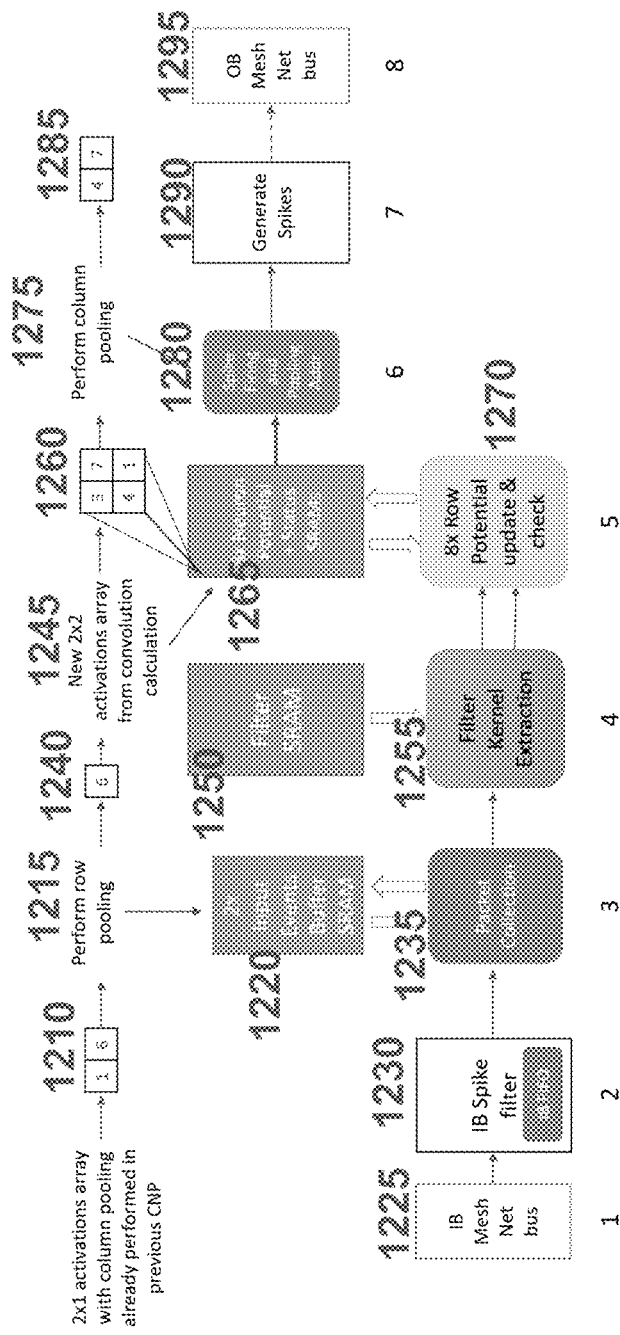
FIG. 12 illustrates the steps where the max pooling operations are being performed.

Step 6 consists of checking the status fire array to see if a neuron has fired and calculating the neuron's x, y, ch. If pooling is enabled in this layer, then the column-wise component of pooling is done at this time. Here it is important to note that implementing the max pooling operation (see Glossary) in two-steps is efficient from a computational standpoint. FIG. 12 shows the steps where the max pooling operations are being performed. Step 7 converts the activation event x, y, ch coordinates local to the CNP to global network coordinates and finds all NPs to deliver the event to. Finally, at step 8, the event is sent through the routing mesh to the relevant NPs.

FIG. 12 Example of a 2×2 max pooling operation being performed. At step 3, row pooling is performed on a 1×2 activations array to produce a single 1×1 activation that is used during step 4 to compute the convolution. Step 5 produces a new 2×2 activations array. Step 6 performs column pooling to reduce the 2×2 activations array to a 1×2 activations array.

Key Innovations of the Event-Based Convolution Implementation

The key innovations of the event-based convolution implementation are:

Performing the 2×2 max pooling operation in two parts; where row pooling is done on step 3 and column pooling is done on step 6 of the event-based convolution algorithm.

Performing row pooling on step 3 is efficient because both elements (activations) of the row are sent whenever they are calculated. If one of the elements is already present in the input events buffer, the second element need only compare itself with the current element to see if it is greater than it. If it is, then it simply overwrites the current element with its own value. This allows the hardware to perform row pooling in an asynchronous manner.

Performing column pooling on step 6 allows the CNP to send only half of the 4 possible elements across the mesh network. This reduces event traffic on the mesh network.

The filters, which contain the weights for the neural network, are arranged by channel in the filter SRAM memory. This configuration allows the hardware to quickly index (find) the correct kernels based only on the input channel. The contiguous sorting of the kernel filters by channel also allows them to be efficiently copied from the filter SRAM to the 8 neural processor engines that perform the convolutional operations.

During step 5 when the convolutions are being computed within each neural processor engine, filter kernels are stored in inverted kernel format so the coordinates of the affected neurons (i.e. their potentials) can be quickly calculated.

The description next discusses some possible figures of merit (or ways to possibly compute them) for the design of the event-based convolution in the CNP. The initial idea for a figure of merit was based on the relationship between the size of an input image with dimensions M×N×C, where M is the height of image, N is the width of the image, and C is the number of channels of the image (this will usually be 3 for color images), the total number of events across the image, and the speed with which a convolutional operation can be performed over the image. The discussion begins with the following basic idea: for large (M, N, and C) images that have very few events per pixel (aka high event sparsity), the event-based convolution implementation will compute the convolution significantly faster than any traditional convolutional approach.

However, there are some challenges associated with this approach. First, because the implementation is so specific, someone could likely use a different event-based convolution implementation that could perform similarly. This would be a problem only if the patent were not broad enough to include all event-based convolution implementations that yield a given figure of merit. Second, the majority of camera technology and image processing approaches are frame-based (not event-based) and thus have no event sparsity per se. Additional assumptions have to be made to include frame-based images in the figure of merit discussion. Third, for the problems that are of current interest in computing, the relationship between image size and event sparsity is such that traditional convolution approaches are faster (but less efficient and higher power) than the event-based approach. This is because it is possible to parallelize traditional convolution operations using GPUs and other specialized hardware devices.

Developing a figure of merit that is centered on efficiency or power consumption seems more appropriate. To do this, one first defines a synaptic operation (SO) as an addition or decrement of an integer to another integer value that represents the neuron potential. The power calculations (not shown) suggest that the hardware spends 5 pJ/SO (picojoules per synaptic operation). This is a measure of efficiency and is independent of the network structure or the input data but specific to the CNP design. The more efficient the hardware is, the smaller this number is. This number varies slightly for different convolution kernel sizes, but the choice is something close to the worst case. Thus, the figure of merit is for a system that performs event-based convolutions with an efficiency of 5 pJ/SO. It may be possible to pair this figure of merit with the previous figure of merit as they are both for event-based convolutions.

Figures of Merit for Novel Unsupervised Learning Rule

The proposed novel unsupervised learning rule is made up of a collection of simple, but significant modifications to the conventional learning rule. In short, the novel unsupervised learning rule is the application of the conventional learning rule to the convolutional connection topology in place of the fully-connected layer topology for which conventional learning rule was developed with additional modifications to ensure the same pattern isn't learned too often. The original conventional algorithm is first described and then the changes are described that allow the conventional learning rule to be applied to convolutional connection topologies.

The conventional unsupervised learning rule finds repeating patterns in data. It is robust to noise and often only requires the pattern to be repeated 2-5 times. The conventional rule can perform dimensionality reduction because neurons learn to become sensitive to only a single pattern and therefore only send a few events indicating whether a particular pattern has been detected. The conventional learning rule detects patterns because the conventional learning rule can only detect a pattern within a packet, which is a collection of events that are close to one another in time. The conventional learning rule assumes binary synapses (weights) that can be either 0 or 1 and binary or ternary activations that can have values of either 0, 1, and in the ternary case, −1. The descriptions will consider the binary weights/binary activations case.

At its core, the conventional learning rule consists of M classes of inputs arranged in a packet of events of length N. N must be less than M. One next connects P neurons to all M inputs with the caveat that each of the neurons may have only W connections (weights) with a value of 1 and M-W connections with a value of 0. To form a packet, you allow N unique events to be placed into a bit-array of length M and represent the presence of an event with a '1' entry and the absence of an event with a '0' entry as is shown in Table 1.

TABLE 1

A single event packet with M = 14 and N = 4.

| Event # | 1 | 2 | 3 | 4 | 5 | 6 | 7 | 8 | 9 | 10 | 11 | 12 | 13 | 14 |
|---|---|---|---|---|---|---|---|---|---|---|---|---|---|---|
| State | 0 | 0 | 1 | 0 | 1 | 0 | 0 | 0 | 0 | 1 | 0 | 1 | 0 | 0 |

Each neuron 'processes' a packet by computing the number of common events between W (a neuron's weights) and the input packet. This computation is efficient because it can be done using a logical bit-wise AND function. The number of matches is the neuron potential. Table 2 shows the matches found in bold/italics. Each neuron has a different firing threshold ($T_{Fire}$) that acts as an activation function because it transforms the potential into a binary activation.

TABLE 2

The weight arrays of 3 neurons is shown processing a packet (W = 3). The matches are in bold/italics. The number of matches is the value of the potential shown in the last column.

| Event # | 1 | 2 | 3 | 4 | 5 | 6 | 7 | 8 | 9 | 10 | 11 | 12 | 13 | 14 | |
|---|---|---|---|---|---|---|---|---|---|---|---|---|---|---|---|
| State | 0 | 0 | 1 | 0 | 1 | 0 | 0 | 0 | 0 | 1 | 0 | 1 | 0 | 0 | Pot. |
| Neuron 1 | 0 | 1 | *1* | 0 | 0 | 0 | 0 | 0 | 0 | 0 | 0 | 0 | 0 | 0 | 1 |
| Neuron 2 | 1 | 0 | *1* | 0 | *1* | 0 | 0 | 0 | 0 | *1* | 0 | 0 | 0 | 0 | 3 |
| ... | | | | | | | | | | | | | | | ... |
| Neuron 3 | 0 | 0 | 0 | 1 | 0 | 1 | 0 | 1 | 0 | 0 | 0 | 0 | 0 | 0 | 0 |

The conventional learning algorithm is as follows. After all neurons have computed their potentials, each compares its potential to both $T_{Fire}$ and the learning threshold, $T_{Learn}$. As mentioned previously, a neuron's output is set to 1 when its potential is over $T_{Fire}$. Whenever a neuron's potential is over $T_{Learn}$, the 'weight swapping rule' is initiated. According to this rule, a certain number of their unused weights, $n_{swap}$, are moved to active but unused inputs. Both unused weights and unused weights are chosen randomly. Unused weights are defined as weights that have a '1' in a position that has a corresponding '0' in the input packet. Unused inputs are defined as those inputs that have a '1' in a position that has a corresponding '0' in the weight array. For instance, in Table 2, Neuron 1 has an unused weight at position 2 because there is a '1' entry in the weights array but the corresponding input packet entry is '0'. Additionally, input event 5 is an unused input when compared with Neuron 1's weight array. The effect of this learning is to gradually make a neuron's weight array more similar to an input pattern that is repeated over time. The neuron's weights are initialized randomly. This allows different neurons to look for different patterns. Of equal importance is the fact that the number of non-zero weights, W stays constant during the learning process. This is critical for unsupervised learning rules because without a homeostatic process (i.e. the constancy of W), the learning rule can easily become unstable and much more difficult to use.

The learning rate, $n_{swap}$, and the learning threshold, $T_{Learn}$, are varied independently for each neuron. When learning begins, a low $T_{Learn}$ is necessary to begin moving the weights. As learning progresses, the potentials caused by the repeating patterns tend to increase. This means that $T_{Learn}$ can slowly be increased to decrease the false alarm rate without missing the patterns. At this point, it's also useful to increase $n_{swap}$ until $n_{swap}=0$. At this point the neuron would no longer learn new patterns. The equations used to adjust $T_{Learn}$ and $n_{swap}$ are as follows:

$$T_{Learn}=\min(T_{max}, \text{potential})$$

$$n_{swap}=\min(n_{min}, n_{swap}-dn_{swap}*(\text{potential}-T_{Learn}))$$

Where $dn_{swap}$ is a parameter that tunes how fast the learning rate is decreased.

Before describing the novel unsupervised learning rule, one needs to define a few terms. FIG. 13 describes event-based convolution using the filter and neuron terms. A filter is a 3D collection of weights (shown in blue) while a neuron is the specific application of a single filter to a specific spatial location of the inputs. A single filter will be applied to every spatial location of the inputs and generate an entire plane of neuron potential entries. During the discussion of the novel unsupervised learning rule, it is important to understand the distinction between these two concepts.

A filter is a 3D collection of weights that has spatial and channel extent. Each filter has a different set of weights. The filters are denoted in blue and have dimensionality 3×3×3 (height=3, width=3, channels=3). Neurons can be defined as filters applied to a specific x,y location of the input as shown at the bottom half. A single neuron has a single entry in the potential array shown in light orange. Each plane of potentials array is generated when a single filter is applied (centered) at every spatial location of the inputs. The single neuron entry in gray in the potential array was calculated from filter 1's weights applied to the location of the input denoted in the lower left display of the input. The dotted red line denotes the receptive field of the neuron centered at the event.

The novel unsupervised learning rule can be described as being based off the conventional learning rule, with the following key changes: (1) the conventional learning rule allows any neurons over their learning threshold, $T_{Learn}$, to learn. The novel unsupervised learning rule only allows one neuron per filter to learn. An additional modification restricts the number of neurons in a layer that can learn to just one; (2) during the weight-swapping, the input events are filtered to include only those events relevant to the specific neuron undergoing learning; and (3) the algorithm now supports pseudo-supervised learning to allow neurons to learn different patterns.

Change 1 (Limiting Neurons Allowed to Learn): Recall that a single filter is applied at every spatial location of the input. The number of neurons per filter allowed to learn at a single event packet must be reduced to one. This is because all neurons for a single filter share a single set of filter weights. The convolutional operation is what allows the system to search for the same pattern at every spatial input location. If the algorithm can find the pattern at any spatial input location, then the algorithm is said to be translation invariant. To preserve translation invariance, only one spatial location (neuron) per filter should be allowed to learn per input packet.

Of additional note is that the current implementation further limits the number of neurons allowed to learn on a single event packet to one per CNP. After some experimentation, it was found that neurons still learned repeating patterns quite quickly. The current hardware design uses this limitation because the weight-swapping component of the learning rule, although simple, is still relatively costly to implement. But, to be clear, we'd like to patent both versions.

Change 2 (Filtering Input Events During Learning): Once a neuron has been selected to learn, the weight swap rule is applied to: (1) the weights corresponding to the neuron's filter; and (2) only the subset of input events that overlap with the receptive field of the neuron's position.

The subset of input events that overlap with the receptive field of the neuron's position are shown in FIG. 13. The events that fall within the dotted-red line are the events that will be used during the learning rule weight swap. Note, that the dotted-red line in FIG. 13 extends to all channels and not just the current channel. In the FIG. 13 example, this means that filter 1, which has size of 3×3×3, has 27 weights and the 27 corresponding input events will be used during the weight-swapping portion of the learning rule. Now, one can see that the 3×3×3 weights and inputs can be flattened into two 1×1×27 linear bit arrays. The original conventional learning rule weight swapping algorithm can now be applied to these bit arrays.

Change 3 (Pseudo-Supervised Learning and Competition): Unsupervised learning algorithms often suffer from a redundancy issue. Without a mechanism to either consolidate similar patterns or allow neurons that represent similar patterns to compete with or inhibit one another, you can easily have many neurons find and learn the same pattern. This is wasteful and should be avoided. The conventional learning rule had no mechanism to prevent this. Pseudo-supervised learning solves this problem by breaking filters into different groups and associating a group label with each filter group. When an input event packet is presented, a group label is presented along with it. Only filters within the group that has the same label as the input event packet are eligible to learn from the input event packet. This allows us to assign different groups of filters to different input event packet labels. Note that it is still possible for filters (and neurons) within a group to learn the same pattern. However, the user now has a mechanism to plan for how much redundancy to allow for a given set of input event packets. This is a significant improvement on the efficiency of the conventional algorithm.

The innovation is a system and method that performs unsupervised learning on an event-based convolutional neural network architecture. The two components that are being combined into a unique system and method are: (1) using an unsupervised learning algorithm on a device; and (2) using an event-based convolutional neural network with the learning algorithm simultaneously on that same device.

The approach of the inventors is unique because of the type of research done between the two research communities of neuromorphic engineering and machine learning. Neuromorphic engineering researchers commonly utilize unsupervised learning algorithms along with event-based systems. However, they very rarely utilize event-based convolution. Machine learning researchers regularly utilize both supervised and unsupervised learning algorithms along with convolution operations. However, they very rarely venture into algorithms that are event-based. The uniqueness of the present approach stems from the fact that the system has bridged the gap between two different research communities.

Winner Takes All

Winner Takes All (WTA) picks at most one winning feature for each location. In a large field of features, too much relevant information may be discarded. Without WTA, the best fitting features at a location will still spike, but they will also be accompanied by spikes of lesser fitting features. Those lesser fitting features cost power and processing time. By applying WTA in strategically chosen groups, the lesser fitting features can be eliminated while retaining all of the best fits.

The power consumption and processing speed of an SNN is strongly tied to the sparsity of spikes in a SNN. The purpose of the present invention is to reduce the number of propagated spikes by strategically grouping the filters from each location in the input stream and applying a WTA technique on those groups. The context of the K-WTA hardware implementation is shown in FIG. 14. The WTA grouping can be hand designed if the kernels are a predefined structure, or a clustering algorithm can be used to define the groups with similar or dissimilar features. The sizes of the groups can vary in size (FIG. 15).

The K-WTA can take operate in multiple modes. FIG. 16 illustrates how the winners are chosen in the "Best Offer" form.

For some features, it is only necessary to know that any one of the potentials in a group is above threshold. This will be the case for dissimilar features where only one of the features is expected to be above threshold. In this case, the processing speed can be increased and the power reduced by only processing filters in a group until any one of them is above threshold. In order to reduce bias, the order of potentials in each group are changed for each pass. FIG. 17 is an example of K-WTA in "First Good Offer" mode.

For context, FIG. 18 shows how an embodiment of this scheme could fit into an Spiking Neural Network architecture. The block diagram for an embodiment that generates the filter results input to the WTA block is shown in FIG. 19.

The foregoing description of the specific embodiments will so fully reveal the general nature of the invention that others can, by applying knowledge within the skill of the art (including the contents of the documents cited and incorporated by reference herein), readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance presented herein, in combination with the knowledge of one skilled in the art.

While various embodiments of the present invention have been described above, it should be understood that they have been presented by way of example, and not limitation. It will be apparent to one skilled in the relevant art(s) that various changes in form and detail can be made therein without departing from the spirit and scope of the invention. Thus, the present invention should not be limited by any of the above-described exemplary embodiments, but should be defined only in accordance with the following claims and their equivalents.

What is claimed is:

1. A system, comprising:
an inbound filter configured to receive spikes and select relevant spikes from the received spikes, wherein the relevant spikes are relevant to a neuron;
a memory configured to store kernels;
a packet collection module configured to collect the relevant spikes until a predetermined number of relevant spikes have been collected in a packet in the memory, and to organize the collected relevant spikes by spatial coordinates in the packet; and
a convolution neural processor configured to perform convolution in the memory.

2. The system of claim 1, wherein the memory is configured to store the kernels in inverted format.

3. The system of claim 1, wherein the received spikes correspond to a plurality of channels, and wherein the packet collection module is further configured to organize the collected relevant spikes by channel in the packet.

4. The system of claim 1, wherein the memory is further configured to store weights indexed by channel.

5. The system of claim 1, wherein the inbound filter removes spikes outside a scope of the convolution neural processor.

6. The system of claim 1, further including a pooling layer, wherein row pooling and column pooling are performed separately.

7. The system of claim 1, wherein the system performs a learning algorithm that limits learning to one neuron per filter.

8. The system of claim 1, wherein the system performs a learning algorithm that limits learning to one neuron per layer.

9. The system of claim 1, wherein the system performs a learning algorithm that includes a winner-take-all algorithm.

10. The system of claim 1, wherein to implement the convolution, the convolution neural processor is configured to:
identify spike values in the relevant spikes;
multiply elements of the kernels by the identified spike values;
calculate a potential using the multiplied elements and spike values; and
transform the potential into an output event.

11. A method for performing convolution, comprising:
receiving, by an inbound filter, spikes generated from digital data;
selecting, by the inbound filter, relevant spikes from the received spikes;
storing kernels in a memory;
collecting the relevant spikes until a predetermined number of relevant spikes have been collected in a packet in the memory;
organizing the collected relevant spikes by spatial coordinates in the packet; and
performing, using a convolution neural processor, a convolution in the memory.

12. The method of claim 11, wherein the kernels are stored in inverted format in the memory.

13. The method of claim 11, further including organizing the collected relevant spikes by channel in the packet, wherein the received spikes correspond to a plurality of channels.

14. The method of claim 13, wherein the storing includes storing weights indexed by the channel.

15. The method of claim 11, wherein the inbound filter removes spikes outside a scope of the convolution neural processor.

16. The method of claim 11, further including pooling in a pooling layer, wherein row pooling and column pooling are performed separately.

17. The method of claim 11, further including performing a learning algorithm that limits learning to one neuron per filter.

18. The method of claim 11, further including performing a learning algorithm that limits learning to one neuron per layer.

19. The method of claim 11, further including performing a learning algorithm that includes a winner-take-all algorithm.

20. The method of claim 11, further including:
identifying spike values in the relevant spikes;
multiplying elements of the kernels by the identified spike values;
calculating a potential using the multiplied elements and spike values; and
transforming the potential into an output event.

21. A system, comprising:
a memory to store spikes and kernels, wherein the spikes are generated from digital data;
a first group of neural processors and a second group of neural processors, each processor including a plurality of spiking neuron circuits configured to perform a task based on the spikes;
wherein each of the first group of neural processors is a convolution neural processor configured to perform an event-based convolution operation using the kernels stored in the memory and spikes relevant to the convolution neural processor in the memory;
wherein each of the second group of neural processors is user configurable to be:
a convolution neural processor, configured to receive spikes in a convolutional connection topology; or
a fully-connected neural processor, configured to receive spikes in a fully-connected connection topology.

22. The system of claim 21, wherein the memory is configured to store kernels in inverted format.

23. The system of claim 21, wherein to perform the event-based convolution, the convolution neural processor is configured to:

identify spike values in the relevant spikes;
multiply elements of the kernels by the identified spike values;
calculate a potential using the multiplied elements and spike values; and
transform the potential into an output event.

24. The system of claim 21, wherein each of the neural processor comprises:
a plurality of parallel engines that update a plurality of neurons circuits and a plurality of synapses in parallel.

25. The system of claim 21, wherein a processor of a second group of processors uses resources of one or more processors of the first group of processors.

26. The system of claim 21, comprising:
an inbound filter configured to receive and select relevant spikes from the received spikes, wherein the relevant spikes are relevant to a neuron; and
a packet collection module configured to collect the relevant spikes until a predetermined number of relevant spikes have been collected in a packet in the memory, and to organize the collected relevant spikes by channel and spatial coordinates in the packet.

27. The system of claim 26, wherein the inbound filter removes spikes outside a scope of the convolution neural processor.

* * * * *